United States Patent
Seo et al.

(10) Patent No.: US 7,879,257 B2
(45) Date of Patent: Feb. 1, 2011

(54) ORGANIC-INORGANIC HYBRID MATERIAL, COMPOSITION FOR SYNTHESIZING THE SAME, AND MANUFACTURING METHOD OF THE SAME

(75) Inventors: Satoshi Seo, Kanagawa (JP); Harue Nakashima, Kanagawa (JP); Ryoji Nomura, Kanagawa (JP)

(73) Assignee: Semiconductor Energy laboratory Co., Ltd. (JP)

( * ) Notice: Subject to any disclaimer, the term of this patent is extended or adjusted under 35 U.S.C. 154(b) by 0 days.

(21) Appl. No.: 12/420,548

(22) Filed: Apr. 8, 2009

(65) Prior Publication Data

US 2009/0206746 A1     Aug. 20, 2009

Related U.S. Application Data

(62) Division of application No. 10/809,130, filed on Mar. 25, 2004, now Pat. No. 7,517,470.

(30) Foreign Application Priority Data

Mar. 26, 2003    (JP)    ............................. 2003-085688

(51) Int. Cl.
     *H01L 31/00*        (2006.01)
(52) U.S. Cl. ............. 252/301.16; 428/690; 428/917; 313/503
(58) Field of Classification Search ............ 252/301.16; 428/690, 917; 313/503
See application file for complete search history.

(56) References Cited

U.S. PATENT DOCUMENTS

| | | | |
|---|---|---|---|
| 4,247,597 A | 1/1981 | Russell, Jr. | |
| 4,362,510 A | 12/1982 | Brauer et al. | |
| 5,318,628 A | 6/1994 | Matijevic et al. | |
| 5,432,014 A | 7/1995 | Sano et al. | |
| 5,466,392 A | 11/1995 | Hironaka et al. | |
| 7,517,470 B2 * | 4/2009 | Seo et al. ............ | 252/62.3 Q |
| 2002/0053871 A1 | 5/2002 | Seo | |
| 2002/0197393 A1 | 12/2002 | Kuwabara | |

FOREIGN PATENT DOCUMENTS

| | | |
|---|---|---|
| CN | 1427001 A | 7/2003 |
| JP | 6-33050 | 2/1994 |
| JP | 6-166501 | 6/1994 |

(Continued)

OTHER PUBLICATIONS

Sanchez, C. et al, "Chemical Modification of Alkoxide Precursors," Journal of Non-Crystalline Solids, vol. 100, 1988, pp. 65-76.

(Continued)

*Primary Examiner*—C. Melissa Koslow
(74) *Attorney, Agent, or Firm*—Husch Blackwell LLP Welsh Katz

(57) ABSTRACT

An organic-inorganic hybrid material comprising a metal oxide and a chelating ligand is synthesized. The function of a coloring property, a light-emitting property, or semiconductivity of the organic-inorganic hybrid material can be controlled by chelating ligand. The organic-inorganic hybrid material is prepared by sol-gel method using sol which includes a metal alkoxide and/or a metal salt and a functional chelating agent.

17 Claims, 13 Drawing Sheets

FOREIGN PATENT DOCUMENTS

| | | |
|---|---|---|
| JP | 3343377 | 6/1994 |
| JP | 9-102628 | 4/1997 |
| JP | 9-279135 | 10/1997 |
| JP | 10-259095 | 9/1998 |
| JP | 11-31588 | 2/1999 |
| JP | 11-263615 | 9/1999 |
| JP | 11-273861 | 10/1999 |
| JP | 2000-306669 | 11/2000 |
| JP | 2002-212422 | 7/2002 |
| JP | 3343377 | 8/2002 |
| JP | 2003-73387 | 3/2003 |
| JP | 2003-77661 | 3/2003 |

OTHER PUBLICATIONS

Sakka, S., "Science of Sol-Gel Method," Agune Shouhuu, Tokyo, 1988, pp. 4-8 (with concise statement).

Shinmou, K. et al, "Fine-Patterning of $ZrO_2$ Thin Films by the Photolysis of Chemically Modified Gel Films," Japanese Journal of Applied Physics, vol. 33, part 2, No. 8B, Aug. 15, 1994, pp. L 1181-L 1184.

Era, M. et al, "Organic-Inorganic Heterostructure Electroluminescent Device Using a Layered Perovskite Semiconductor $(C_6H_5C_2H_4NH_3)_2PbI_4$," Applied Physics Letters, vol. 65, No. 6, Aug. 8, 1994, pp. 676-678.

Wen, J. et al, "Organic/Inorganic Hybrid Network Materials by the Sol-Gel Approach," Chem Mater, vol. 8, No. 8, 1996, pp. 1667-1681.

Yamada, N. et al, "Synthesis and Dynamic Mechanical Behaviour of Inorganic-Organic Hybrids Containing Various Inorganic Components," J. Mater Chem., vol. 7, No. 8, 1997, pp. 1491-1495.

Dantas De Morais, T. et al, "Hybrid Organic-Inorganic Light-Emitting Diodes," Adv. Mater, vol. 11, No. 2, 1999, pp. 107-112.

Section 4 Optical Material Relation: "Manufacture and Application of Organic-Inorganic Composite Coating Thin Film," Organic-Inorganic Hybrid Material (Technical Data Collections) Technical Information Institute Co., Ltd., Jul. 30, 1999, pp. 208-215 (with full English translation, pp. 1-11).

Schneider, M. et al, "Novel Electroluminescent Devices Based on Perylene-Doped Sol-Gel Layers," Adv. Mater, vol. 12, No. 5, 2000, pp. 351-354.

Takeda, S. et al, "Modification of Sol-Gel-Derived Amorphous $Al_2O_3$ Thin Films by $F_2$ Excimer Laser Irradiation at Ambient Temperature," J. Mater Res., vol. 16, No. 4, Apr. 2001, pp. 1003-1009.

Sakka, S., Concise Statement re: sol-gel method, Ceramics, vol. 37, No. 3, 2002, pp. 136-142.

Liang, P. et al, "ICP-AES Detection of Ultratrace Aluminum(III) and Chromium(III) Ions with a Microcolumn Preconcentration System Using Dynamically Immobilized 8-Hydroxyquinoline on $TiO_2$ Nanoparticles," Analytical Sciences, vol. 19, Aug. 2003, pp. 1167-1171.

International Search Repart re application No. PCT/JP2004/003610, dated Jun. 22, 2004 (in Japanese).

Ritten Opinion re application No. PCT/JP2004/003610, dated Jun. 22, 2004 (with partial English translation).

Office Action re Chinese application No. CN 200480014783.3, dated Mar. 16, 2007 (with English translation).

"SciFinder" software search results re Chemical Abstracts database, dated Apr. 25, 2008, American Chemical Society, for dyes including: 1) Acid Red 183 (6408-31-7), 2) Acid Yellow 99 (10343-58-5), 3) Mordant Blue 99 (3624-68-8), 4) Mordant Blue 3 (3561-18-9), 5) Mordant Blue 29 (1667-99-8), 6) Mordant Red 3 (130-22-3), 7) Acid Blue 45 (2861-02-1).

Sakka, S., "Trend of Sol-Gel Technology," Ceramics, vol. 37, No. 3, 2002, pp. 136-142.

* cited by examiner

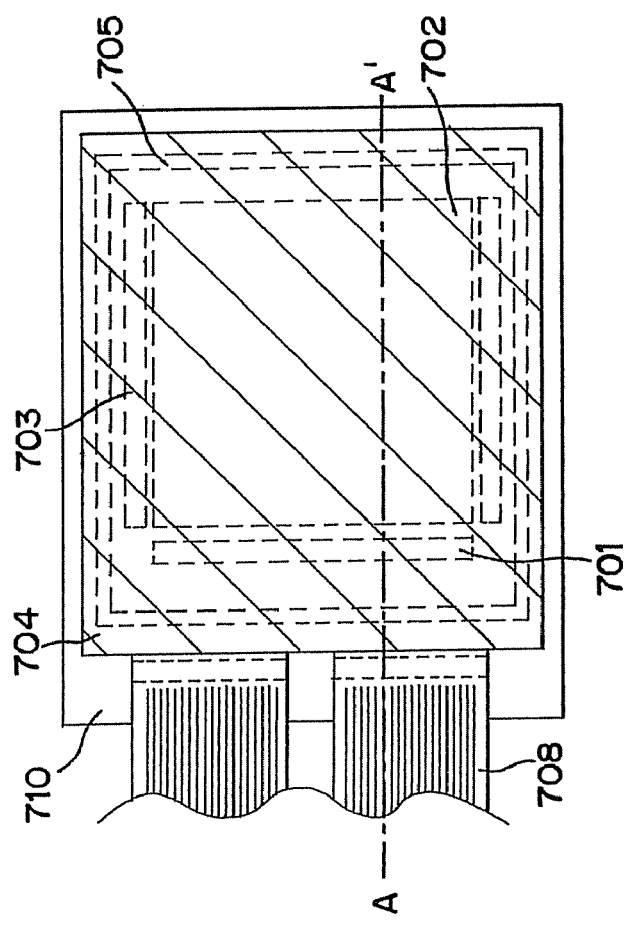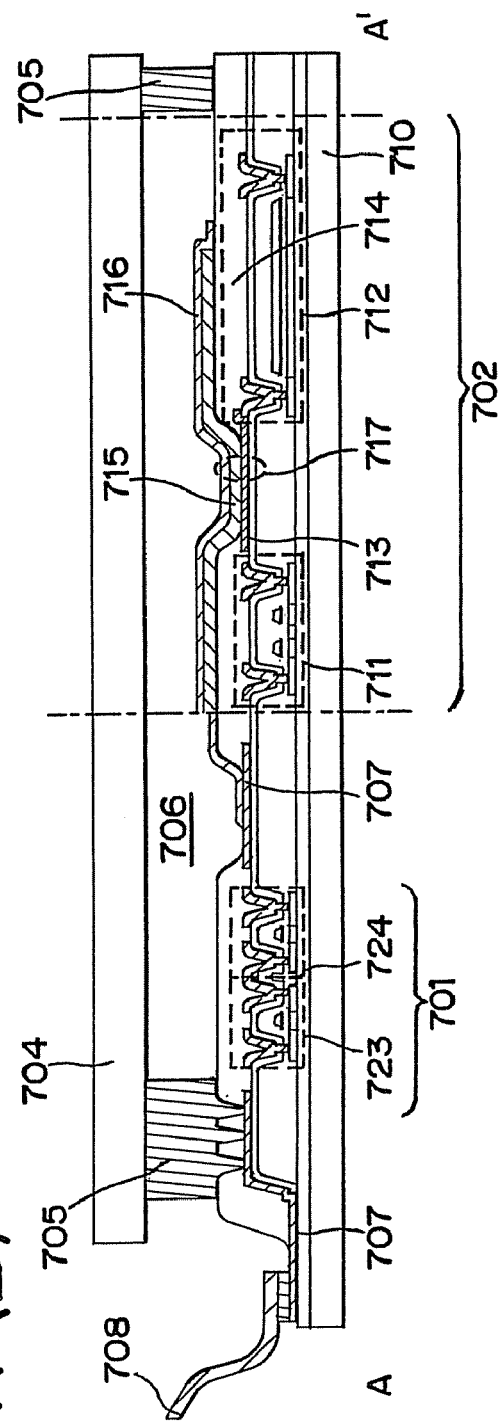
FIG.7(A)
FIG.7(B)

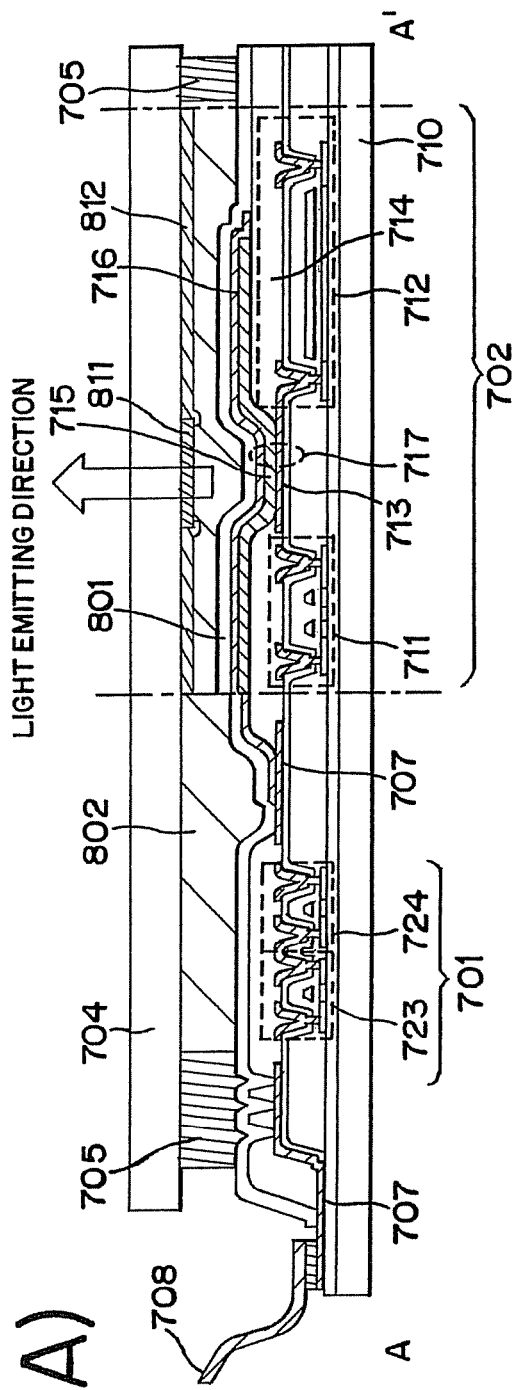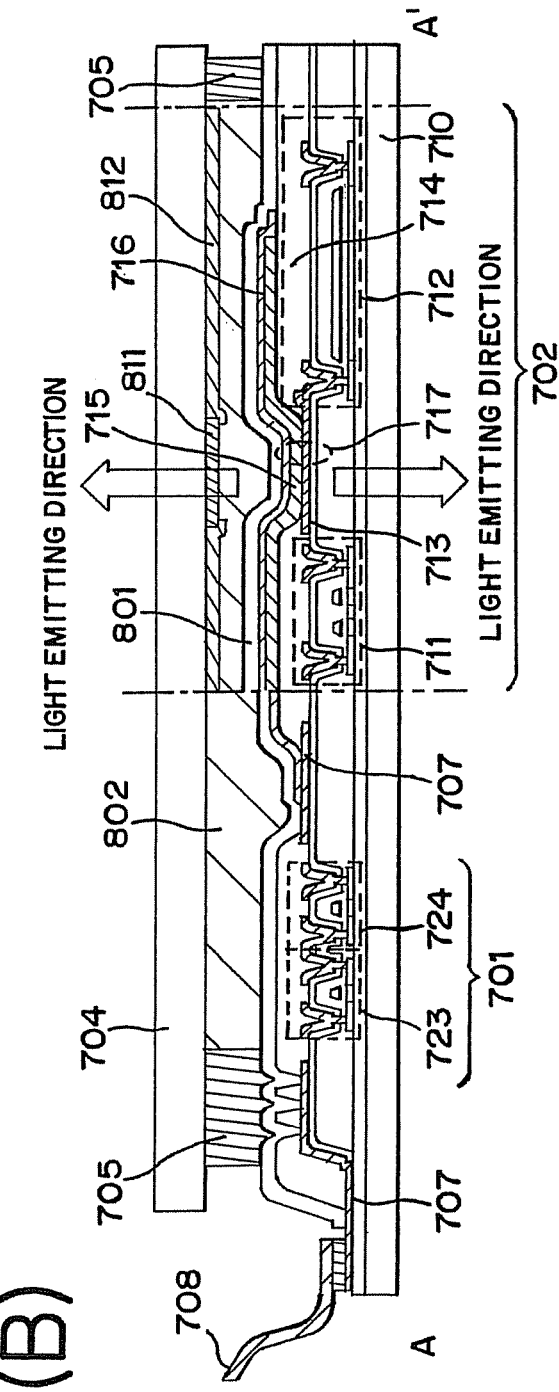

OPENING AND CLOSING DIRECTION OF DISPLAY PORTION

ORGANIC-INORGANIC HYBRID MATERIAL, COMPOSITION FOR SYNTHESIZING THE SAME, AND MANUFACTURING METHOD OF THE SAME

This application is a divisional of application Ser. No. 10/809,130 filed on Mar. 25, 2004 (now U.S. Pat. No. 7,517,470 issued Apr. 14, 2009).

TECHNICAL FIELD

The present invention relates to an organic-inorganic hybrid material that has a metal oxide matrix and a composition for coating application as a material of the organic-inorganic hybrid material, and in addition, relates to a manufacturing method of the organic-inorganic hybrid material.

BACKGROUND OF THE INVENTION

As a functional material such as a photonics, electronic, chemical, or biological material, an organic-inorganic hybrid material has been actively developed recently.

There are some proposed synthetic methods of an organic-inorganic hybrid material. For example, intercalation of an organic polar molecule into a layer-structured inorganic compound is known. By using this method, there are proposed applications such as an application to a photonic memory material or an excimer-fluorescent coating material (refer to Patent Document 1) and an application to an organic EL device (non-Patent Document 1).

[Patent Document 1]

Japanese Patent Laid-Open No. 11-263615

[Non-Patent Document 1]

M. Era, et al., Applied Physics Letters, vol. 65, No. 8, 676-678 (1994)

Further, sol-gel method has drawn particular attention as a synthetic method of an organic-inorganic hybrid material. The sol-gel method is one kind of chemical reactions, in which a solid is prepared by a liquid phase reaction, and is a synthetic method, in which a state (sol) where colloid is stable with sufficient fluidity is prepared to make a transition to a solid state (gel) that does not have the fluidity any more by evaporating a solvent and the like. As for details of the sol-gel method like this, knowledge can be obtained from a lot of publications (for example, refer to Non-Patent Document 2). In addition, the sol-gel method has been already put into practical use nowadays as a manufacturing process for various coating films and bulk bodies while attracting attention originally as a technique for manufacturing glass (refer to Non-Patent Document 3).

[Non-Patent Document 2]

Sumio Sakka, "Science of Sol-Gel Method", Agune Shouhuu, Tokyo, 4-8 (1988)

[Non-Patent Document 3]

Sumio Sakka, *Ceramics*, vol. 37, No. 3, 136-142 (2002)

Then, when a state of dried gel that can be obtained by this sol-gel method is used as a final product, an organic-inorganic hybrid material into which a heat-sensitive organic group or organic compound (that is, an organic moiety) is introduced can be easily synthesized with heat treatment at low temperatures from 100 to 200° C. In other words, being able to form an inorganic matrix (in particular, an oxide matrix) at low temperatures can be said to be one of advantages of the sol-gel method in synthesizing an organic-inorganic hybrid material.

Now, in the case of synthesizing an organic-inorganic hybrid material by the sol-gel method, miscibility between an inorganic matrix and an organic moiety is important. Stated another way, in order for the organic moiety not to condense to cause a phase separation, it is required that some sort of interaction is given between the inorganic matrix and the organic moiety to disperse uniformly.

As a method for that purpose, it is generally accepted that organosilicate is used to make organic-inorganic hybrid. The organosilicate is silicate that has an organic group partially substituted for an alkoxyl group, which is typified by polydimethyl siloxane. Since an organic-inorganic hybrid material in which an inorganic matrix and an organic moiety are bonded (have interaction) through a covalent bond can be synthesized by hydrolysis and polycondensation of the organosilicate like this, a phenomenon such as the foregoing phase separation is not caused.

An organic-inorganic hybrid material that can be the organosilicate like this has characteristics of an inorganic compound such as great heat resistance and characteristics of an organic compound such as flexibility in combination. For example, an organic-inorganic hybrid material that has such properties as rubber and great heat resistance is synthesized by using polydimethyl siloxane (refer to Non-Patent Document 4). Further, there are applications such as an application to a sliding member (refer to Patent Document 2).

[Non-Patent Document 4]

Noriko Yamada, et al., *Journal of Materials Chemistry*, vol. 7, No. 8, 1491-1495 (1997)

[Patent Document 2]

Japanese Patent Laid-Open No. 2002-212422

In addition, there is an organic-inorganic hybrid material synthesized by sol-gel method while an organic compound is further added to organosilicate. In this case also, a phase separation can be avoided by giving an interaction such as π-π stacking between an organic group of the organosilicate and the added organic compound, which is efficient. As applications, an application to a colored glass bottle by adding a pigment (refer to Non-Patent Document 5) and an application to an organic EL device by adding a light-emitter (refer to Non-Patent Documents 6 and 7 and Patent Documents 3 and 4) are considered, which also can be said to have high mechanical strength and durability of an inorganic compound and various optical properties (absorption and luminescence properties) of an organic compound in combination.

[Non-Patent Document 5]

Organic-Inorganic Hybrid Material (Technical Data Collections) (Technical Information Institute Co., Ltd.), 208-215

[Non-Patent Document 6]

Tony Dantas de Morais, et al., *Advanced Materials*, vol. 11, No. 2, 107-112 (1999)

[Non-Patent Document 7]

Monika Schneider, et al., *Advanced Materials*, vol. 12, No. 5, 351-354 (2000)

[Patent Document 3]

Japanese Patent Laid-Open No. 9-279135

[Patent Document 4]

Japanese Patent Laid-Open No. 2000-306669

As described above, by using organosilicate, an organic-inorganic hybrid material that has a silica matrix and has characteristics of organic compound and inorganic compound in combination can be synthesized. However, it is a matter of course that these methods can be only applied to an organic-inorganic hybrid material that has a silica matrix.

A lot of metal oxides exist, which are superior in aspects such as durability, heat resistance, and mechanical characteristics. Further, sol-gel method using silicate needs an acid or an alkali basically and takes a long time to galate completely, which is not useful for a process either. Consequently, it is important to discover a method of synthesizing an organic-inorganic hybrid material that has a metal oxide matrix other than silica matrix.

A method itself of manufacturing not an organic-inorganic hybrid material but simply a metal oxide by so-gel method is well known, where it is often the case that a metal alkoxide is used as a starting material. This case has an advantage that an acid or alkali is unnecessary unlike silicate. However, since a metal alkoxide has a fairly quick rate of hydrolysis (refer to Non-Patent Document 8), it is a drawback to generate precipitation such as a hydroxide or an oxide as soon as water for hydrolysis and polycondensation is added, with the result that it is not possible to prepare stable sol.

[Non-Patent Document 8]

Jianye Wen, et al., *Chemistry of Materials*, No. 8, 1667-1681 (1996)

In order to overcome this, it is necessary to make a reaction rate of hydrolysis slower. As a well-known method, a chemical modification (for example, chelate stabilization) is kwon (refer to Non-Patent Document 9), which prevents a rapid formation of a network due to hydrolysis by partially substituting a β-diketone, an alkanol amine, or the like for an alkoxyl group of a metal alkoxide. According to the chemical modification like this, a coating film of a metal oxide material such as zirconia that has a superior strength can be formed by sol-gel method (refer to Patent Document 5).

[Non-Patent Document 9]

C. Sanches, et al., *Journal of Non-Crystalline Solids*, vol. 100, 65-76 (1998)

[Patent Document 5]

Japanese Patent Laid-Open No. 10-259095

In addition, there is also an example where a property of a coordinating β-diketone is applied to patterning of a metal oxide (refer to Non-Patent Document 10 and Patent Document 6). In other words, since a chelating β-diketone absorbs light in an ultraviolet region and becomes easily-removable by irradiating ultraviolet corresponding to the absorption, by irradiating ultraviolet after coating sol stabilized with a β-diketone, hydrolysis and polycondensation progress only in the irradiated portion to galate easily. Then, patterning becomes possible since a region that is not irradiated, which does not gelate, can be washed away with a solvent.

[Non-Patent Document 10]

Katsuhide Shinmou, et al., *Japanese Journal of Applied Physics*, vol. 33, No. 8B, L1181-L1184 (1994)

[Patent Document 6]

Japanese Patent No. 3343377

However, all of these reports are methods for preparing a metal oxide by so-gel method, which are not a report on a synthesis of an organic-inorganic hybrid material that has a metal oxide matrix.

As described above, most of organic-inorganic hybrid materials have a silica matrix while there are few that have a metal oxide matrix. It is possible to just prepare sol in which a metal alkoxide and some sort of organic compound are dissolved in the same solvent to synthesize an organic-inorganic hybrid material by sol-gel method. However, the above-mentioned problem with respect to miscibility comes out since a metal oxide matrix in this case eventually has no organic group. Therefore, an organic-inorganic hybrid material in which an organic group is directly connected to a metal oxide matrix is required.

Further, even in the chemical modification (chelate stabilization) using a β-diketone, which is reported in the above-mentioned Non-Patent Document 10 and Patent Document 6, the β-diketone is added to stabilize sol, which is eventually desorbed by calcination or irradiation of ultraviolet. In other words, it is not possible to realize an organic-inorganic hybrid material that develops a different function from a mere metal oxide by remaining directly connected to a metal oxide matrix.

Consequently, it is an object of the present invention to provide an organic-inorganic hybrid material that has an organic group directly connected to a metal oxide. In particular, it is an object thereof to provide a functional organic-inorganic hybrid material in which an organic group directly connected to a metal oxide develops a coloring property, a light-emitting property, or semiconductivity.

In addition, it is an object of the present invention to provide a material (a composition for coating application) for synthesizing an organic-inorganic hybrid material according to the present invention. Further, it is an object thereof to provide a method of using the composition for coating application to manufacture an organic-inorganic hybrid material according to the present invention.

SUMMARY OF THE INVENTION

A lot of earnest studies of the inventors have found out that an organic-inorganic hybrid material to achieve the objects can be synthesized by adding an organic compound (typically, a fluorescent chelating agent) that shows a coloring property, a light-emitting property, or semiconductivity by chelating a metal atom to a solution of a metal alkoxide, a chemically modified metal alkoxide, or a metal salt to prepare sol, and by applying sol-gel method.

An organic-inorganic hybrid material according to the present invention has a structure based on a distinctly novel idea that an organic group (chelating agent) that is able to develop a coloring property, a light-emitting property, or semiconductivity is bonded to a metal oxide matrix.

A structure of the present invention is an organic-inorganic hybrid material that has a metal oxide matrix that has one kind or plural kinds of metal atoms and a ligand bonded to the metal atom by chelating, where the ligand shows a coloring property, a light-emitting property, or semiconductivity by chelating the metal atom. Hereinafter, a ligand that has the above-mentioned function is referred to as a functional chelating agent.

Further, as the functional chelating agent, any of an organic compound in which a chelate is formed by a phenolic group and a heterocycle with a nitrogen atom as a hetero atom, an organic compound in which a chelate is formed by a phenolic group and a carbonyl group, an organic compound in which a chelate is formed by a phenolic group and an azomethine group, an organic compound in which a chelate is formed by a carboxyl group and a heterocycle with a nitrogen atom as a hetero atom, an organic compound in which a chelate is formed by a carboxyl group and a carbonyl group, an organic compound in which a chelate is formed by a carboxyl group and an azomethine group, and an organic compound in which a chelate is formed by a hydroxylamino group and a carbonyl group is preferable.

In these functional chelating agents, each of the phenolic group in case that the chelating agent has the phenolic group, the carboxyl group in case that the chelating agent has the carboxyl group, and the hydroxyl group in case that the chelating agent has the hydroxylamino group is subjected to deprotonation and an oxygen atom is bonded to the metal atom. Then, the chelate is formed due to a formation of a coordinate bond by the nitrogen atom of the heterocycle, the azomethine group, or the carbonyl group. These functional chelating agents are useful since a coloring property, a light-emitting property, or semiconductivity can be easily developed by bonding to the metal atom and, what is more, the bonding strength for the metal is strong.

Further, any of 8-hydroxyquinoline and derivatives thereof, 10-hydroxybenzo[h]-quinoline and derivatives thereof, 2-(2-hydroxyphenyl) benzoxazole and derivatives thereof, 2-(2-hydroxyphenyl) benzothiazole and derivatives thereof, 2-(2-hydroxyphenyl) benzoimidazole and derivatives thereof, 2-(2-hydroxyphenyl) pyridine and derivatives thereof, 3-hydroxyflavone and derivatives thereof, 5-hydroxyflavone and derivatives thereof, salicylideneamine and derivatives thereof, picolinic acid and derivatives thereof, coumarin-3-carboxylic acid and derivatives thereof, salicylidene aminoacid and derivatives thereof, benzylideneamino acid and derivatives thereof, N-benzoyl-N-phenyl-hydroxylamine and derivatives thereof, and N-cynnamoyl-N-phenyl-hydroxylamine and derivatives thereof, is more preferable as the functional chelating agent.

It is preferable that the metal atom of the metal oxide matrix in the organic-inorganic hybrid material according to the present invention is any element selected from the group consisting of magnesium, calcium, strontium, barium, scandium, yttrium, lanthanum, titanium, zirconium, hafnium, zinc, aluminum, gallium, and indium. By using a metal oxide matrix that has these elements, particularly strong light emitting can be achieved.

Additionally in the present invention, an aromatic compound may be further added to the above-mentioned organic-inorganic hybrid material according to the present invention. As the aromatic compound to be added at this time, it is preferable to be an organic pigment, an organic light emitter, or an organic semiconductor from the standpoint of functionality in the present invention.

Here, it is one of features that the organic-inorganic hybrid material according to the present invention can have a light-emitting property and semiconductivity in combination. Accordingly, the present invention also includes a carrier-injection type electroluminescent device using the organic-inorganic hybrid material according to the present invention and a light-emitting device using the electroluminescent device. Obviously, the organic-inorganic hybrid material according to the present invention can be made an insulator depending on an amount of the functional chelating agent. Therefore, an intrinsic electroluminescent device can also be manufactured. In addition, a light-emitting device using the intrinsic electroluminescent device can also be manufactured.

The light-emitting device indicates an image display device or light-emitting device using an electroluminescent device as a light-emitting element. In addition, a module that has a connecter, such as a flexible printed circuit (FPC) a TAB (Tape Automated Bonding) tape, or a TCP (Tape Carrier Package), attached to an electroluminescent device, a module that has a printed wiring board provided at the tip of a TAB tape or a TCP, and a module that has an IC (integrated circuit) directly mounted on an electroluminescent device by a COG (Chip On Glass) method are all included in the light-emitting device.

Further, the organic-inorganic hybrid material according to the present invention is useful since coating on glass is easily achieved so that a glass product that has functional (such as coloring or light emitting) coating carried out can be made. Accordingly, the present invention includes a glass product that has the organic-inorganic hybrid material deposited.

Now, it is preferable to synthesize the above-mentioned organic-inorganic hybrid material according to the present invention by sol-gel method. Therefore, it is also an important invention to provide sol (a composition for coating application) that is used at this time. Accordingly, a composition for coating application according to the present invention has a structure of a composition for coating application including at least a metal alkoxide that has one kind or plural kinds of metal atoms and/or a metal salt, the above-mentioned functional chelating agent, and an organic solvent. As metal species of the metal alkoxide and the metal salt, it is preferable to be any element selected from the group consisting of magnesium, calcium, strontium, barium, titanium, zirconium, hafnium, zinc, aluminum, gallium, and indium.

In addition, it is preferable that the amount of the functional chelating agent to be added as the composition for coating application is 1 equivalent or less for the metal alkoxide and/or the metal salt on the ground that the organic-inorganic hybrid material according to the present invention is required to form the metal oxide matrix.

As the organic solvent in the composition for coating application, it is preferable to be an organic solvent including a lower alcohol, tetrahydrofuran, or acetonitril. At this time, it is more preferable as the lower alcohol to be any alcohol selected from the group consisting of methanol, ethanol, n-propanol, isopropanol, n-butanol, sec-butanol, and tert-butanol.

Further, since the composition for coating application according to the present invention is stabilized to some extent by the functional chelating agent serving as a chemical modifier (chelating stabilizer), water may further be added. It is preferable that the amount of the added water in this case is 2 equivalents or more and 6 equivalents or less for the metal alkoxide and/or the metal salt.

Further, in order to further stabilize the composition for coating application not to produce precipitation, a chemical modifier may be further added to the above-mentioned composition for coating application according to the present invention. In this case, it is preferable to use a β-diketone that is a chelating stabilizer as the chemical modifier. The amount of the added chemical modifier is preferably 0.5 equivalents or more and 6 equivalents or less for the metal alkoxide and/or the metal salt.

Moreover, in the present invention, an aromatic compound may be further added to the above-mentioned composition for coating application according to the present invention. As the aromatic compound to be added at this time, it is preferable to be an organic pigment, an organic light emitter, or an organic semiconductor from the standpoint of functionality in the present invention.

Now, a manufacturing method of coating the above-mentioned composition for coating application on a base material to form a film of the organic-inorganic hybrid material according to the present invention is also related to the present invention. Accordingly, the present invention also includes a manufacturing method of an organic-inorganic hybrid material, where calcining is carried out at a temperature of 100° C. or more and 300° C. or less under an atmospheric pressure or under a reduced pressure after wet coating of the composition for coating application according to the present invention on a base material.

Further, in the case where the composition for coating application according to the present invention includes a β-diketone as a chemical modifier, ultraviolet with a wavelength that has overlap with an ultraviolet spectrum of a state of the β-diketone chelating the metal may be irradiated and after that, calcining may be carried out at a temperature of 100° C. or more and 300° C. or less under an atmospheric pressure or under a reduced pressure.

In addition, in the above-mentioned manufacturing method, it is preferable to be any of a dip coating method, a spin coating method, and an inkjet method as a method for the wet coating.

By implementing the present invention, it is possible to provide an organic-inorganic hybrid material that has an organic group directly connected to a metal oxide. In particular, it is possible to provide a functional organic-inorganic hybrid material in which an organic group directly connected to a metal oxide develops a coloring property, a light-emitting property, or semiconductivity.

In addition, by implementing the present invention, it is possible to provide a material (a composition for coating application) for synthesizing an organic-inorganic hybrid material according to the present invention. Further, it is possible to provide a method of using the composition for coating application to manufacture an organic-inorganic hybrid material according to the present invention.

BRIEF DESCRIPTION OF DRAWINGS

FIGS. 7(A) and 7(B) are schematic diagrams of a light-emitting device according to the present invention.

FIGS. 8(A) and 8(B) are schematic diagrams of a light-emitting device according to the present invention.

DETAILED DESCRIPTION OF THE PRESENTLY PREFERRED EMBODIMENTS

An embodiment mode of the present invention will be described below.

Figure 1:
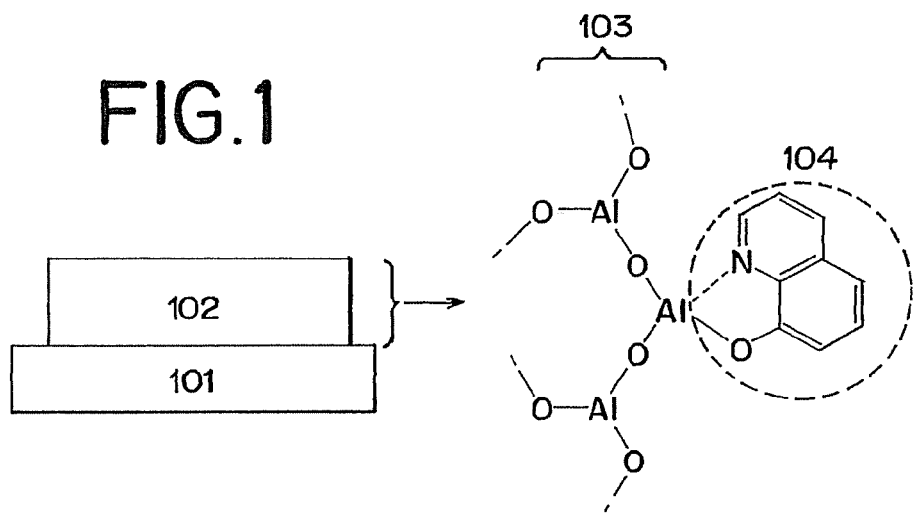
FIG. 1 is a conceptual diagram of a thin film using an organic-inorganic hybrid material according to the present invention.

First, a fundamental conception of the present invention will be described with reference to FIG. 1. In FIG. 1, a case where an organic-inorganic hybrid material 102 according to the present invention, which uses an alumina matrix as a metal oxide matrix and 8-quinolinol as a functional chelating agent, is deposited on a base material 101 will be described as an example. Also in the case of using another metal oxide matrix, in the case of using a complex metal oxide matrix that has a plurality of metal elements, or in the case of using another functional chelating agent, the fundamental principle is the same.

As shown in FIG. 1, a fundamental structure of the present invention has a state of a functional chelating agent 104 chelating a metal atom of a metal oxide matrix 103 in a pendant shape. Consequently, the functional chelating agent 104 is combined with the metal oxide matrix 103 while keeping the functional chelating agent 104 forming the chelate, and a nonconventional novel property (a light emission of an organic compound due to a fluorescent chelating agent can be obtained while having a sturdy moiety of a metal oxide, and the like) can be expected.

Figure 2:
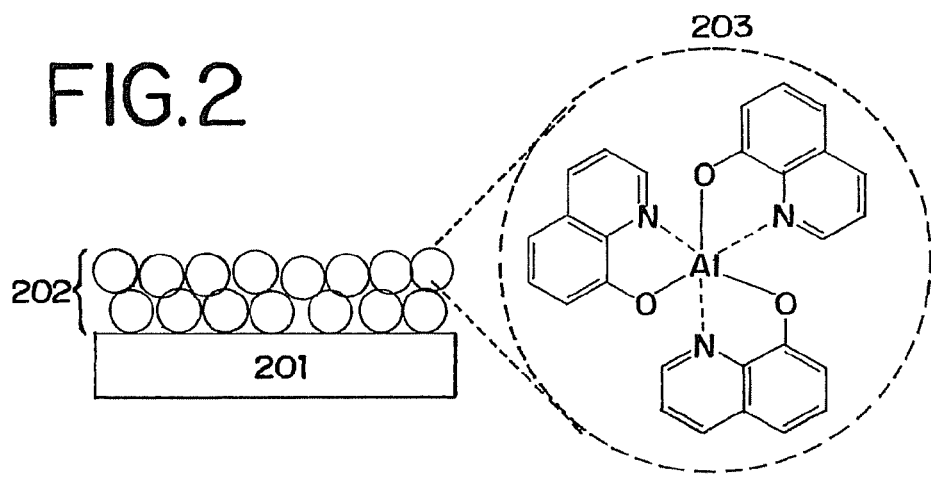
FIG. 2 is a conceptual diagram of a conventional molecular thin film.

Here, for comparison, FIG. 2 shows a conceptual diagram in the case where a luminescent metal complex ($Alq_3$) that has three of 8-quinolinol bonded to aluminum is used to form a thin film 202 (such as a deposited film) thereof on a base material 201. This thin film is an aggregate (a molecular thin film) of an $Alq_3$ molecule 203, and the molecule 203 has only interaction due to a weak intermolecular force with each other. On the other hand, when a thin film is formed of the organic-inorganic hybrid material shown in FIG. 1 according to the present invention, a luminescence property similar to that of $Alq_3$ is shown, and what is more, the film is formed by the metal oxide matrix, that is, covalent bond. Therefore, the thin film is superior also in heat resistance, mechanical strength, and the like.

In addition, in the organic-inorganic hybrid material according to the present invention, which is not a state of an organic compound just dispersed in the metal oxide matrix, the metal oxide matrix and the functional chelating agent have interaction with each other by a strong bond of chelate coordination. Therefore, a problem such as a phase separation is not caused.

In addition, since an organic group of the functional chelating agent have a bond with the metal oxide matrix in the organic-inorganic hybrid material as shown in FIG. 1, there is no phase separation caused even when an aromatic compound is further added to form an organic-inorganic hybrid material. The conception will be described with reference to FIG. 3.

Figure 3:
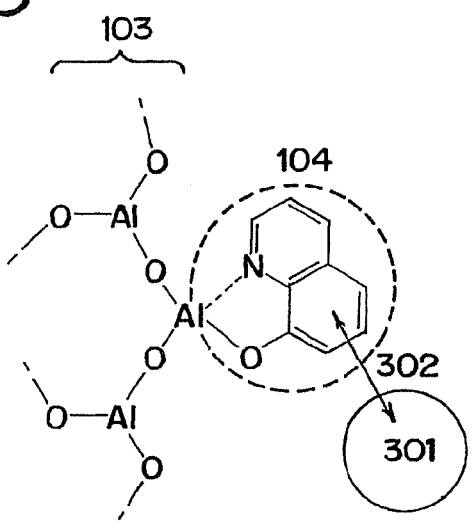
FIG. 3 is a conceptual diagram of an organic-inorganic hybrid material according to the present invention, to which an aromatic compound is added.

In FIG. 3, there is the state of the functional chelating agent 104 chelating the metal atom of the metal oxide matrix 103 in the pendant shape as in FIG. 1. In the case where an aromatic compound 301 is further added to this state, π-π stacking interaction 302 is generated between the aromatic compound 301 and the functional chelating agent 104 since there is a π-electron in the functional chelating agent 104. Consequently, a phenomenon such as a phase separation can be avoided. Based on this standpoint, it is desirable that the functional chelating agent 104 has a π-electron, which is, however, not always necessary.

Figure 4:
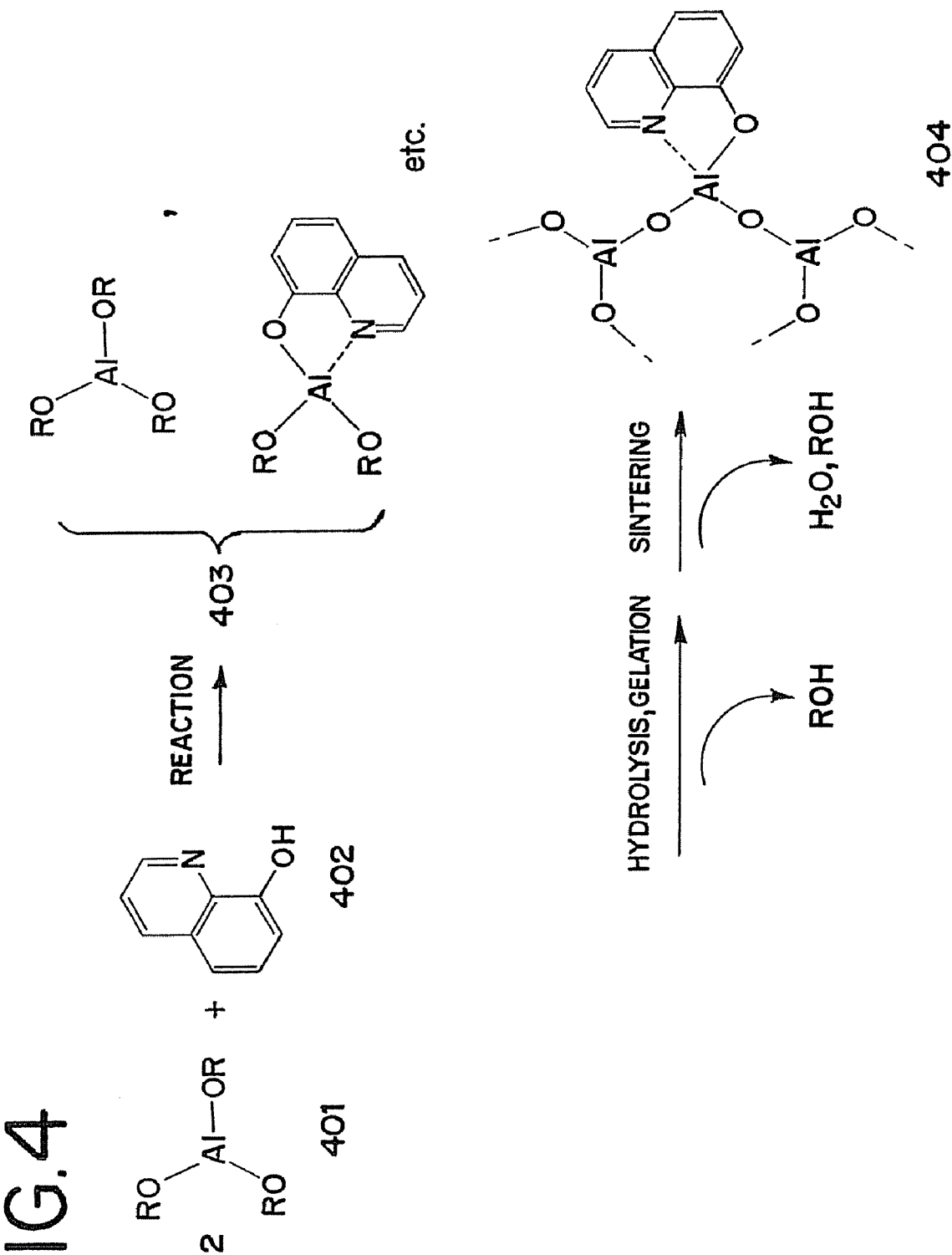
FIG. 4 is a diagram showing a manufacturing method of an organic-inorganic hybrid material using a composition for coating application according to the present invention.
Figure 5:
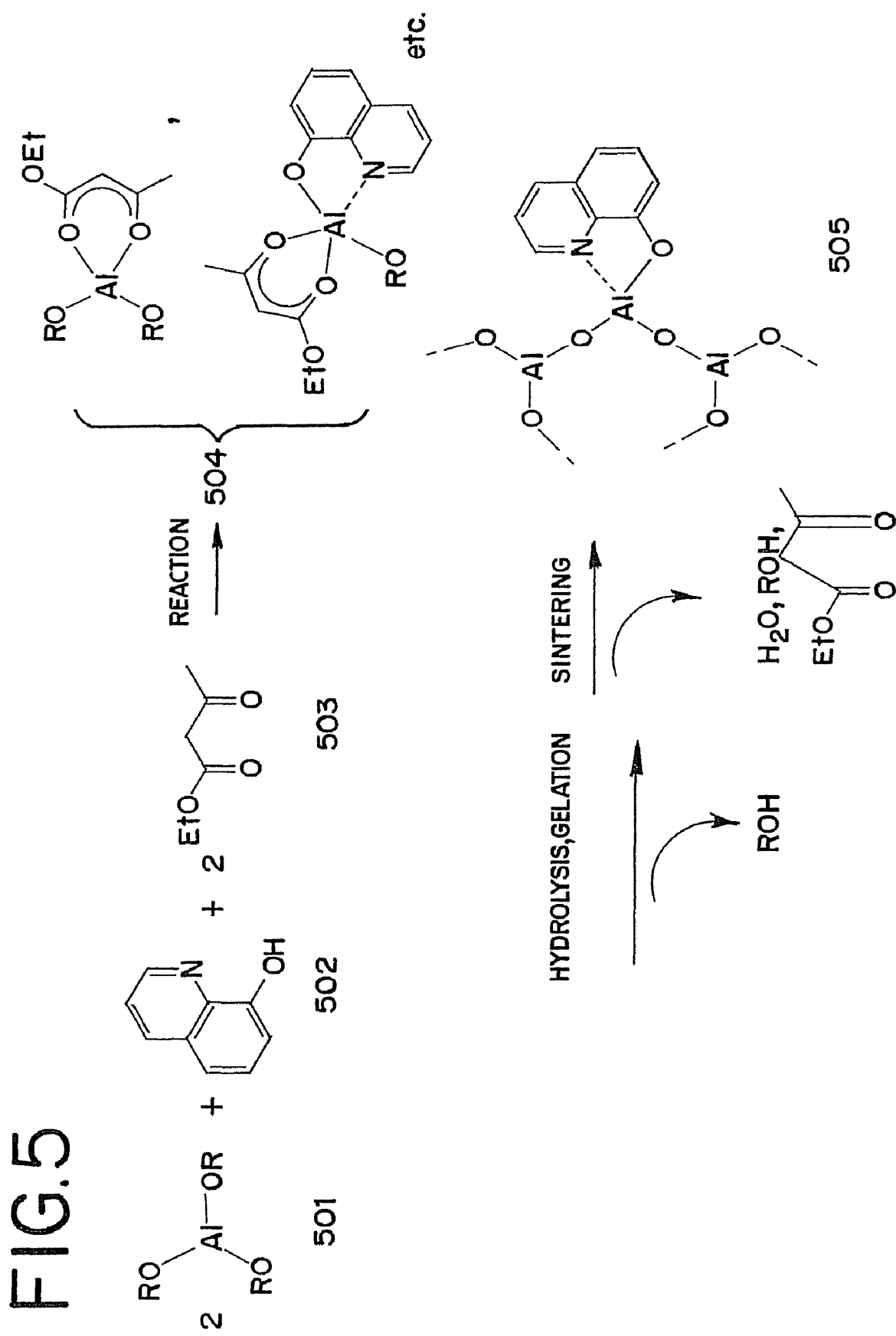
FIG. 5 is a diagram showing a manufacturing method of an organic-inorganic hybrid material using a composition for coating application according to the present invention.

Next, as a method for synthesizing the organic-inorganic hybrid material as shown in FIG. 1, a method of preparing sol including a metal alkoxide and a functional chelating agent (a composition for coating application according to the present invention) to be used for synthesizing by sol-gel method will be exemplified. FIG. 4 and FIG. 5 show schemes thereof. In FIG. 4 and FIG. 5, a case of using an aluminum alkoxide as a metal alkoxide and 8-quinolinol as a functional chelating agent, will be described as an example. Also in the case of using another metal alkoxide, in the case of using a plurality of metal alkoxides, in the case of using a complex metal alkoxide that has a plurality of metal elements, in the case of using a metal salt, or in the case of using another functional chelating agent, the fundamental principle is the same.

FIG. 4 is a case of using the functional chelating agent also as a chemical modifier (chelating stabilizer). In FIG. 4, a solution 403 in which a metal alkoxide 401 and a functional chelating agent 402 are dissolved in an appropriate organic solvent at a ratio of 2:1 [unit; mmol] to react is prepared to obtain an organic-inorganic hybrid material 404 according to the present invention by hydrolysis, polycondensation, and calcining. As for an amount of added water, it is preferable to be 2 equivalents or more and 6 equivalents or less for the metal alkoxide since the metal of the metal alkoxide is usually divalent to hexavalent. However, the hydrolysis is not always necessary.

Further, in the method of FIG. 4, 8-quinolinol is used both as roles of a functional chelating agent and a chemical modifier (chelating stabilizer). Therefore, in the case of reducing the amount of 8-quinolinol, the stabilization ability is significantly damaged. Consequently, as shown in FIG. 5, another chemical modifier may further be added.

In other words, FIG. 5 shows a case where a solution 504 in which a metal alkoxide 501 and a functional chelating agent 502, and a chemical modifier 503 are dissolved in an appropriate organic solvent at a ratio of 2:1:2 [unit; mmol] to react is prepared to obtain an organic-inorganic hybrid material 505 according to the present invention by hydrolysis, polycondensation, and calcining. As for an amount of added water, as in the above-mentioned case, it is preferable to be 2 equivalents or more and 6 equivalents or less for the metal alkoxide. However, the hydrolysis is not always necessary.

In addition, although ethyl acetoacetate is used here as the chemical modifier 503, the chemical modifier is not limited to this in the present invention, and may be any one as long as it stabilizes sol not to produce precipitation and is easily desorbed eventually by calcining or the like. Furthermore, generally, as long as the amount of the added chemical modifier is 0.5 equivalents or more for the metal alkoxide, an effect can be exerted. Moreover, since the metal of the metal alkoxide is generally hexavalent or less, it is preferable that the amount of the added chemical modifier is 6 equivalents or less.

The above-mentioned method can be applied in a similar way also when the organic-inorganic hybrid material as shown in FIG. 3 is synthesized. In other words, what to do is only adding an aromatic compound further to the above-mentioned sol and synthesizing the organic-inorganic hybrid material by sol-gel method in a similar way.

Also, as a process for obtaining the organic-inorganic hybrid material according to the present invention from the sol prepared as described above, gelation and sintering may be carried out by calcining at a temperature of 100° C. or more and 300° C. or less under an atmospheric pressure or under a reduced pressure after wet coating of the sol on a base material.

In addition, as shown in FIG. 5, in the case where a β-diketone (ethyl acetoacetate in FIG. 5) is added as the chemical modifier, after wet coating of the sol on a base material, gelation may be carried out by irradiating ultraviolet with a wavelength that has overlap with an ultraviolet spectrum of a state of the β-diketone coordinating the metal atom (in FIG. 5, a state of ethyl acetoacetate coordinating aluminum) to desorb the β-diketone. Then, after that, the organic-inorganic hybrid material according to the present invention can be obtained by calcining at a temperature of 100° C. or more and 300° C. or less under an atmospheric pressure or under a reduced pressure.

Here, a dip coating method, a spin coating method, and an inkjet method can be used as the above-mentioned wet coating method, which is, however, not limited to these.

Next, materials that can be used for manufacturing the organic-inorganic hybrid material according to the present invention will be specifically exemplified below. The organic-inorganic hybrid material according to the present invention, as shown in FIG. 1, has at least the functional chelating agent and the metal oxide matrix.

First, as the functional chelating agent, any of an organic compound in which a chelate is formed by a phenolic group and a heterocycle with a nitrogen atom as a hetero atom, an organic compound in which a chelate is formed by a phenolic group and a carbonyl group, an organic compound in which a chelate is formed by a phenolic group and an azomethine group, an organic compound in which a chelate is formed by a carboxyl group and a heterocycle with a nitrogen atom as a hetero atom, an organic compound in which a chelate is formed by a carboxyl group and a carbonyl group, an organic compound in which a chelate is formed by a carboxyl group and an azomethine group, and an organic compound in which a chelate is formed by a hydroxylamino group and a carbonyl group is preferable.

As the organic compound in which a chelate is formed by the phenolic group and the heterocycle with the nitrogen atom as the hetero atom, 8-hydroxyquinoline and derivatives thereof shown by the following structure formulas (1) to (8) are representative. In addition, another compounds include 10-hydroxybenzo[h]-quinoline (the following structure formula (9)), 2-(2-hydroxyphenyl) benzoxazole (the following structure formula (10)), 2-(2-hydroxyphenyl) benzothiazole (the following structure formula (11)), a derivative of 2-(2-hydroxyphenyl) benzoimidazole (the following structure formula (12) and (13)), 2-(2-hydroxyphenyl) pyridine and a derivative thereof (the following structure formulas (14) and (15)), and the like. Further, compounds such as quinoxalines, phenazines, and naphthyridines, shown by the following structure formulas (16) to (18), can also be applied. However, the organic compound is not limited to these in the present invention.

[Chemical Formula 1]

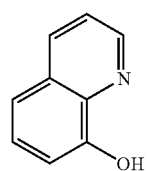

(1)

-continued
(2) 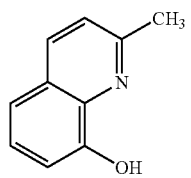
(3) 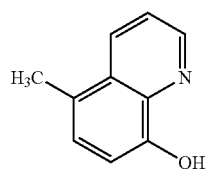
(4) 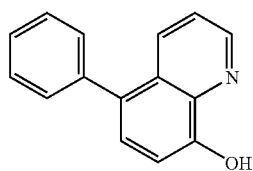
(5) 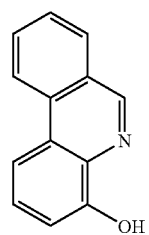
(6) 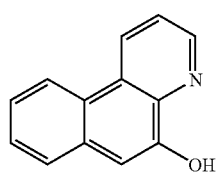
(7) 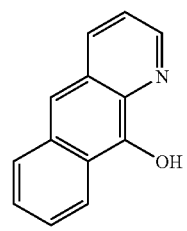
(8) 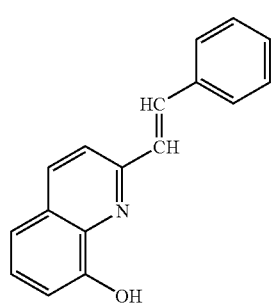
[Chemical Formula 2]
-continued
(9) 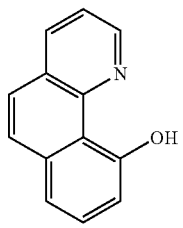
(10) 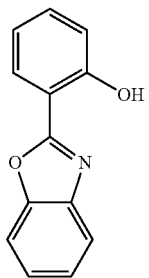
(11) 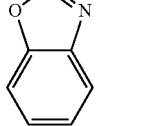
(12) 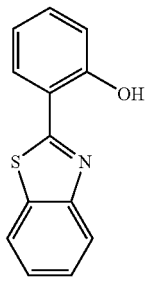
(13) 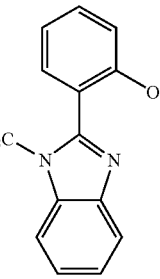
(14) 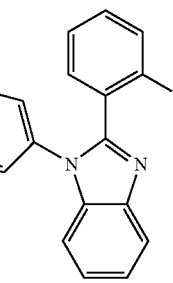

-continued (15)

[Chemical Formula 3]

(16)

(17)

(18)

As the organic compound chelating by the phenolic group and the carbonyl group, 3-hydroxyflavone (the following structure formula (19)), 5-hydroxyflavone (the following structure formula (20)), and the like are representative. Further, and compounds such as acetophenones and benzophenones, represented by the following structure formulas (21) and (22), can also be applied. However, the organic compound is not limited to these in the present invention.

[Chemical Formula 4]

(19)

-continued (20)

(21)

(22)

As the organic compound which a chelate is formed by the phenolic group and the azomethine group, derivatives of salicylideneamine shown by the following structure formulas (23) to (27) are representative. Further, a salicylideneamine dimmer can be used as shown by the following structure formulas (28) to (31). However, the organic compound is not limited to these in the present invention.

[Chemical Formula 5]

(23)

(24)

(25)

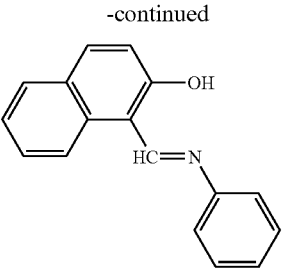

(26)

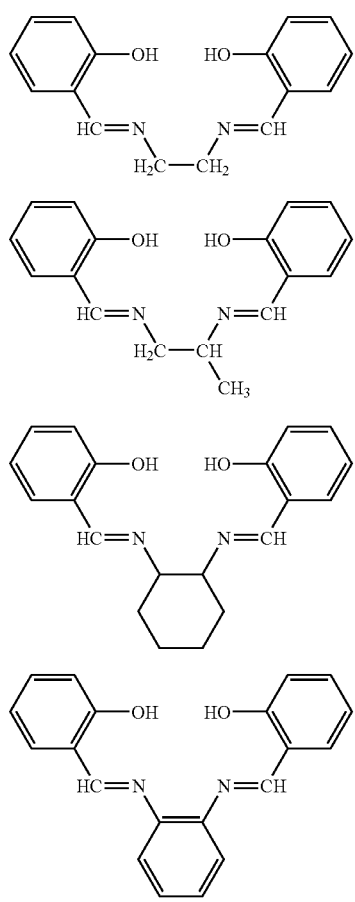

[Chemical Formula 6]

(28)

(29)

(30)

(31)

As the organic compound in which a chelate is formed by the carboxyl group and the heterocycle with the nitrogen atom as the hetero atom, picolinic acid and derivatives thereof by the following structure formulas (32) to (34) are representative. Further, compounds such as pyridines, represented by the following structure formula (35), can also be applied.

However, the organic compound is not limited to these in the present invention. In the present invention, as shown by the following structure formulas (32) to (35), the structure in which the carboxyl group is directly bonded to a conjugated carbon atom is preferable from the standpoints of a light-emitting property and semiconductivity.

[Chemical Formula 7]

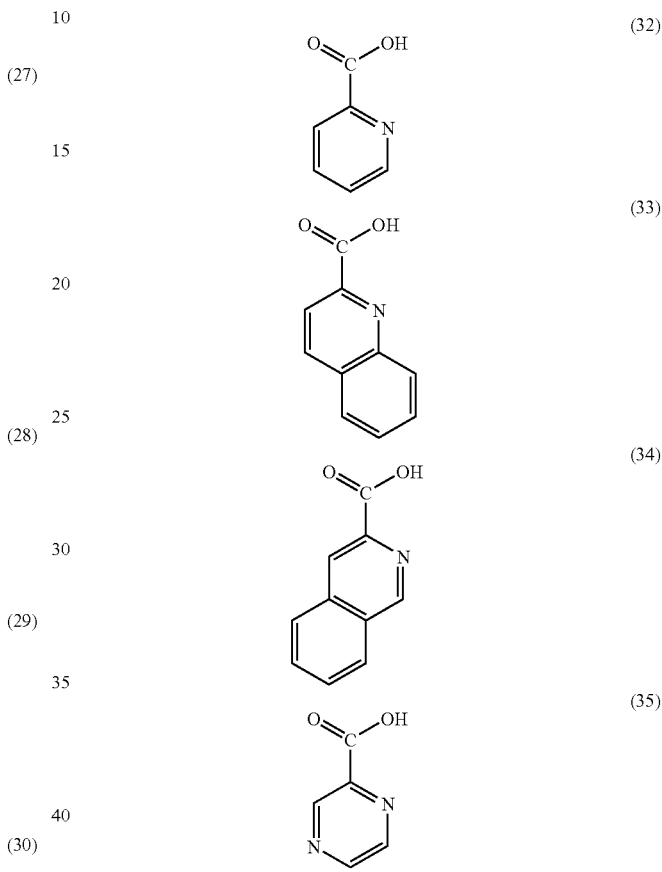

As the organic compound in which a chelate is formed by the carboxyl group and the carbonyl group, coumarin-3-carboxylic acid (the following structure formula (36)) is representative. Further, chromone-3-carboxylic acid (the following structure formula (37)) and the like can also be applied. However, the organic compound is not limited to these in the present invention. In the present invention, as shown by the following structure formulas (36) and (37), the structure in which the carboxyl group is directly bonded to a conjugated carbon atom is preferable from the standpoints of a light-emitting property and semiconductivity.

[Chemical Formula 8]

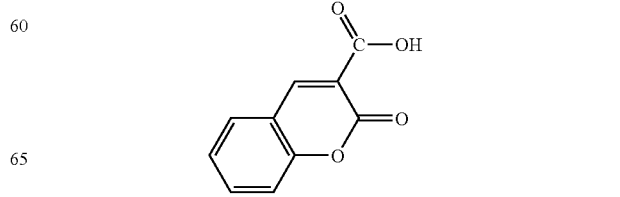

(37)
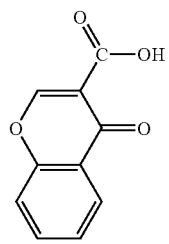

As the organic compound in which a chelate is formed by the carboxyl group and the azomethine group, salicylidene aminoacids represented by the following structure formulas (38) to (40) (Since a metal is coordinated also by a phenolic group, these are also the above-mentioned organic compound in which a chelate is formed by the phenolic group and the azomethine group) and benzylideneamino acids represented by the following structure formulas (41) to (43) are representative. However, the organic compound is not limited to these in the present invention. In the present invention, as shown by the following structure formulas (38) to (43), the structure in which an aromatic ring is bonded to a carbon atom of the azomethine group is preferable from the standpoints of a light-emitting property and semiconductivity.

[Chemical Formula 9]

(38)
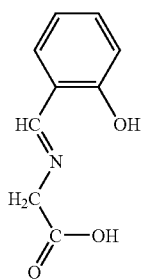

(39)
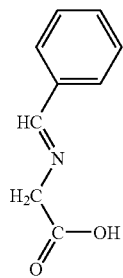

(40)
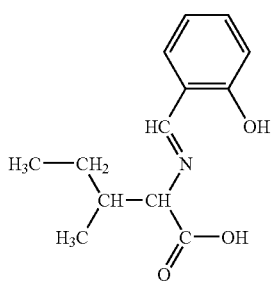

(42)
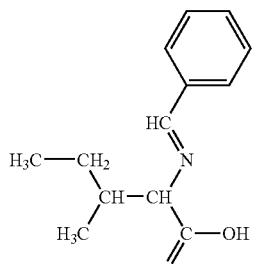

(40)
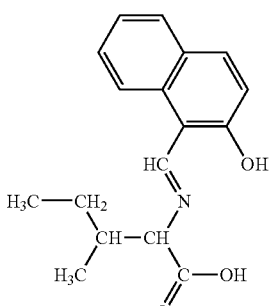

(43)
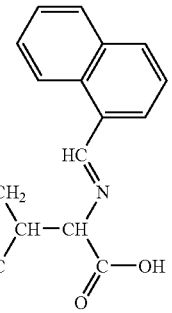

As the organic compound in which a chelate is formed by the hydroxylamino group and the carbonyl group, N-benzoyl-N-phenyl-hydroxylamine and derivatives thereof (the following structure formulas (44) and (45)), and N-cynnamoyl-N-phenyl-hydroxylamine (the following structure formula (46)) and derivatives thereof, and the like are representative. However, the organic compound is not limited to these in the present invention. In the present invention, as shown by the following structure formulas (44) to (46), the structure in which the carbonyl group is directly bonded to a conjugated carbon atom or the structure in which the hydroxylamino group is directly bonded to a conjugated carbon atom is preferable from the standpoints of a light-emitting property and semiconductivity.

[Chemical Formula 10]

(44)
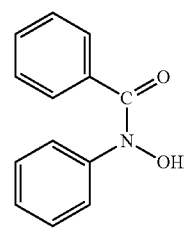

-continued

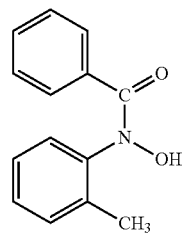

(45)

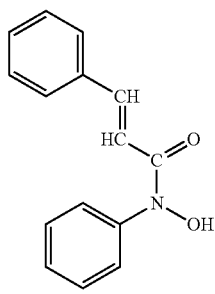

(46)

On the other hand, as the metal element of the metal oxide matrix, typical metals and transition metals are possible. In particular, a light-emitting property becomes effective by applying magnesium, calcium, strontium, barium, scandium, yttrium, lanthanum, titanium, zirconium, hafnium, zinc, aluminum, gallium, indium, or the like. On the contrary, when the other transition element is applied, it is often the case that a light-emitting property becomes weakened, however, a coloring property becomes effective since a visible light region is absorbed due to a d-d transition.

In addition, as a material for forming the metal oxide matrix, on the premise of sol-gel method, metal alkoxides are appropriate as described above, which include kinds such as metal n-propoxide, isopropoxide, n-butoxide, sec-butoxide, and tert-butoxide. Since a liquid phase reaction is used in sol-gel method, it is preferable that these alkoxides are liquid or easy to dissolve in an organic solvent.

The organic solvent may be any one as long as the functional chelating agent and the metal alkoxide can be dissolved therein, which includes lower alcohols, tetrahydrofuran (THF), acetonitril, chloroform, dichloroethane, chlorobenzene, and acetone, and these can be used singularly or by mixture. In particular, considering that water is added for hydrolysis and polycondensation, lower alcohols, THF, and acetonitril are preferable since these are easy to be mixed with water. In addition, it is one reason why these solvents are preferable that they easily evaporate by calcining.

As the above-mentioned lower alcohols, methanol, ethanol, n-propanol, isopropanol, n-butanol, sec-butanol, and tert-butanol can be used. As for these alcohols, it is preferable to use one that is similar in kind to the alkoxyl group of the metal alkoxide (In other words, n-propanol when n-propoxide is used as the metal alkoxide) from the standpoint of preventing an exchange reaction of the alkoxyl group and the standpoint of solubility.

In addition, known ones can be used as the chemical modifier, and β-diketones typified by acetylacetone, ethyl acetoacetate, benzoyl acetone, and the like are preferable.

Furthermore, although an aromatic compound can be further added to the organic-inorganic compound material as shown in FIG. 3, organic pigments, organic light emitters, or organic semiconductors can be used as the aromatic compound in this case. The organic pigments include phthalocyanine derivatives, anthraquinone derivatives, violanthrone, phenolphthalein, malachitegreen, and the like, which are useful as pigments for coloring. The organic light emitters include phosphorescent materials such as bis(2-phenylpyridinato-N,$C^{2'}$) (acetylacetonato) iridium (abbreviation: Ir(ppy)$_2$(acac)) and bis (2-(2'-benzothienyl) pyridinato-N,$C^{3'}$) (acetylacetonato) iridium (abbreviation: Ir(btp)$_2$(acac)), in addition to fluorescent materials of coumarin derivatives, rhodamines, and fluoresceins. The organic semiconductors include hole transporting materials such as 4,4'-bis[N-(3-methylphenyl)-N-phenyl-amino]-biphenyl (abbreviation: TPD), 4,4'-bis[N-(1-naphthyl)-N-phenyl-amino]-biphenyl (abbreviation: α-NPD), 4,4',4"-tris(N,N-diphenyl-amino)-triphenylamine (abbreviation: TDATA), and 4,4',4"-tris[N-(3-methylphenyl)-N-phenyl-amino]-triphenylamine (abbreviation: MTDATA) and electron transporting materials such as 2-(4-biphenylyl)-5-(4-tert-butylphenyl)-1,3,4-oxadiazole (abbreviation: PBD), 1,3-bis[5-(p-tert-buthylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), and bathocuproine (abbreviation: BCP).

Embodiment Mode 1

It is an object of the present embodiment mode to provide a material that has an organic group directly bonded to a metal oxide matrix and is able to develop a different function from that of a mere metal oxide, and a synthesized organic-inorganic hybrid material will be described. The organic-inorganic hybrid material according to the present invention, as shown in FIG. 1, has at least a functional chelating agent and the metal oxide matrix.

First, as the functional chelating agent, any of an organic compound in which a chelate is formed by a phenolic group and a heterocycle with a nitrogen atom as a hetero atom, an organic compound in which a chelate is formed by a phenolic group and a carbonyl group, an organic compound in which a chelate is formed by a phenolic group and an azomethine group, an organic compound in which a chelate is formed by a carboxyl group and a heterocycle with a nitrogen atom as a hetero atom, an organic compound in which a chelate is formed by a carboxyl group and a carbonyl group, an organic compound in which a chelate is formed by a carboxyl group and an azomethine group, and an organic compound in which a chelate is formed by a hydroxylamino group and a carbonyl group is preferable.

The organic compounds which forms a chelate include, for example, the compounds shown by the aforementioned structure formulas (1) to (46), but are not limited to these in the present invention.

On the other hand, as the metal element of the metal oxide matrix, various kinds of typical metals and transition metals are possible. In particular, a light-emitting property becomes effective by applying magnesium, calcium, strontium, barium, scandium, yttrium, lanthanum, titanium, zirconium, hafnium, zinc, aluminum, gallium, indium, or the like. On the contrary, when other transition elements are applied, it is often the case that a light-emitting property becomes weakened, however, a coloring property becomes more effective since a visible light region is absorbed due to a d-d transition.

In addition, the metal oxide matrix may further include an oxide moiety of a metalloid (such as boron, silicon, germanium, tin, or bismuth). In particular, a silica moiety or an organosiloxane moiety that is an oxide moiety of silicon is preferable. By introducing these moieties, an optical property such as a lower refractive index can be given. The organosiloxane moiety has an organic group, and a methyl group, a phenyl group a naphthyl group, or the like can be applied as the organic group while an organic group that has a π-electron, such as a phenyl group or a naphtyl group, is preferable in particular. However, the organic group is not limited to those.

Further, as shown in FIG. 3, the organic-inorganic hybrid material according to the present invention can further include an aromatic compound, and organic pigments, organic light emitters, or organic semiconductors can be used as the aromatic compound in this case. The organic pigments include phthalocyanine derivatives, anthraquinone derivatives, violanthrone, phenolphthalein, malachitegreen, and the like, which are useful as pigments for coloring. The organic light emitters include phosphorescent materials such as Ir(ppy)$_2$(acac) and Ir(btp)$_2$(acac) in addition to fluorescent materials of coumarin derivatives, rhodamines, and fluoresceins. The organic semiconductors include hole transporting materials such as TPD, α-NPD, TDATA, and MTDATA and electron transporting materials such as PBD, OXD-7, TAZ, p-EtTAZ, BPhen, and BCP.

By making the above-mentioned structure, it is possible to realize the organic-inorganic hybrid material that has the organic group directly bonded to the metal oxide matrix and is able to develop the different function from that of a mere metal oxide. More specifically, it is possible to realize a functional organic-inorganic hybrid material that develops a coloring property, a light-emitting property, or semiconductivity due to the organic group directly bonded to the metal oxide matrix.

In order to show the coloring property, it is necessary just to have a peak of an absorption spectrum at least between 350 nm and 800 nm, preferably between 380 nm and 760 nm. While visible light has a wavelength range of 380 nm to 760 nm, the coloring property is shown with a peak of an absorption spectrum between 350 nm and 800 nm since a portion of the absorption spectrum is overlapped with the wavelength range of the visible light.

In addition, as for the light-emitting property, while the emission wavelength is not particularly limited, it is preferable to have a peak of an emission spectrum in the wavelength range of 380 nm to 760 nm in order to obtain an emission of visible light. As for the semiconductivity, a conductivity in the range of $10^{-10}$ to $10^3$ S/cm is preferable. Additionally, like an organic semiconductor, one belonging to the category of an insulator in terms of a dark conductivity, in which a space-charge limited current flows by formed to be a thin film, may be believed to have the semiconductivity.

Further, the organic-inorganic hybrid material shown in the present embodiment mode can solve the problem with respect to miscibility due to a metal oxide matrix that has no organic group eventually, which has been the conventional problem.

Embodiment Mode 2

A composition for coating application for synthesizing the organic-inorganic hybrid material shown in Embodiment Mode 1 will be described below. The composition for coating application according to the present invention includes at least a metal alkoxide and/or a metal salt, a functional chelating agent, and an organic solvent.

As for specific examples of the functional chelating agent, organic compounds such as the above-mentioned structure formulas (1) to (46) may be used. It is preferable that the amount of the added functional chelating agent is 0.01 equivalents or more and 2 equivalents or less for the metal alkoxide, more preferably 0.1 equivalent or more and 1 equivalent or less. These ranges can effectively prevent precipitation.

Kinds of the metal alkoxide include metal methoxide, ethoxide, n-propoxide, isopropoxide, n-butoxide, sec-butoxide, and tert-butoxide, and the like. On the other hand, the metal salt includes a metal chloride and a metal acetate. As kinds of the metals in these metal alkoxides and metal salts, magnesium, calcium, strontium, barium, scandium, yttrium, lanthanum, titanium, zirconium, hafnium, zinc, aluminum, gallium, and indium, and the like are preferable. Since a liquid phase reaction is used in sol-gel method, it is preferable that these alkoxides and salts are liquid or easy to dissolve in an organic solvent.

In addition, on the ground that an oxide moiety of a metalloid (such as boron, silicon, germanium, tin, or bismuth) is further introduced to the organic-inorganic hybrid material according to the present invention, a metalloid alkoxide may be added to the composition for coating application according to the present invention. Kinds of the alkoxide in this case include methoxides, ethoxides, n-propoxides, isopropoxides, n-butoxides, sec-butoxides, and tert-butoxides of these metalloids, and the like.

In particular, on the ground that a silica moiety or an organosiloxane moiety is further introduced to the organic-inorganic hybrid material according to the present invention, an alkoxysilane, an organoalkoxysilane, or an organosiloxane may be singularly or by mixture added to the composition for coating application according to the present invention. The composition for coating application, to which these are added, is unlikely to generate precipitation to have an advantage of favorable conservation stability. As the added amount, it is preferable to be 0.5 equivalent or more and 10 equivalents or less for the number of metal atoms within the composition for coating application, and in particular, in the range of 1 equivalent or more and 2 equivalents or less, extremely high conservation stability can be obtained. The alkoxysilane includes tetramethoxysilane, tetraethoxysilane, and the like. In addition, the organoalkoxysilane includes triethoxymethylsilane, triethoxyphenylsilane, triethoxy-1-naphtylsilane, and the like. In addition, as the organosiloxane, polydimethylsiloxane and the like are representative.

The organic solvent may be any one as long as the functional chelating agent and the metal alkoxide can be dissolved therein, which includes lower alcohols, tetrahydrofuran (THF), acetonitril, chloroform, dichloroethane, chlorobenzene, and acetone, and these can be used singularly or by mixture. In particular, considering that water is added for hydrolysis and polycondensation, lower alcohols, THE, and acetonitril are preferable since it is easy to be mixed with water. In addition, it is one reason why these solvents are preferable that these solvents are easily evaporated by calcining.

As the above-mentioned lower alcohols, it is preferable to have one to six carbon atoms, and methanol, ethanol, n-propanol, isopropanol, n-butanol, sec-butanol, and tert-butanol can be used. As for these alcohols, it is preferable to use one that is similar in kind to the alkoxyl group of the metal alkoxide (in other words, n-propanol when n-propoxide is used as the metal alkoxide) from the standpoint of preventing an exchange reaction of the alkoxyl group and the standpoint of solubility.

Further, in the case of adding water to the composition for coating application according to the present invention, it is preferable to be 2 equivalents or more and 6 equivalents or less for the metal alkoxide and/or the metal salt since the metals of the metal alkoxide and/or the metal salt are usually divalent to hexavalent.

Further, the composition for coating application according to the present invention may include a chemical modifier, and known ones can be used as the chemical modifier while β-diketones typified by acethylacetone, ethyl acetoacetate, benzoyl acetone, and the like is preferable. In addition, chemical modifiers such as monoethanolamine, diethanolamine, triethanolamine, acetol, asetoin, acetic acid, lactic acid, mandelic acid, citric acid, tartaric acid, oxalic acid, diacethyl, and ethylenediamine can be used. It is preferable that the amounts of these chemical modifiers are 0.5 equivalent or more and 6 equivalents or less for the metal alkoxide and/or the metal salt.

Further, as shown in FIG. 3, on the ground that an aromatic compound is further added to the organic-inorganic hybrid material according to the present invention, the composition for coating application according to the present invention may include an aromatic compound. As the aromatic compound in this case, the organic pigments, organic light emitters, and organic semiconductors mentioned in Embodiment Mode 1 can be used.

By using the above-mentioned composition for coating application, it is possible to realize the organic-inorganic hybrid material that has the organic group directly bonded to the metal oxide matrix and is able to develop the different function from that of a mere metal oxide, as shown in Embodiment Mode 1. More specifically, it is possible to realize a functional organic-inorganic hybrid material that develops a coloring property, a light-emitting property, or semiconductivity due to the organic group directly bonded to the metal oxide matrix.

Further, by using the composition for coating application, shown in the present embodiment mode, to synthesize the organic-inorganic hybrid material, it is possible to solve the problem with respect to miscibility due to a metal oxide matrix that has no organic group eventually, which has been the conventional problem.

Now, the application range of the organic-inorganic hybrid material according to the present invention includes applications to stained glass and fluorescent grass by coating on glass. In addition, other useful applications include an application to an electroluminescent device. Below, an embodiment mode of the electroluminescent device will be described in detail.

Embodiment Mode 3

In the Embodiment Mode 3, a structure of a carrier-injection type electroluminescent device using an organic-inorganic hybrid material according to the present invention will be described with reference to FIG. 6(a). Although a substrate is omitted in FIG. 6(a), the substrate may be on any side of an anode 601 and a cathode 603.

Figure 6A:
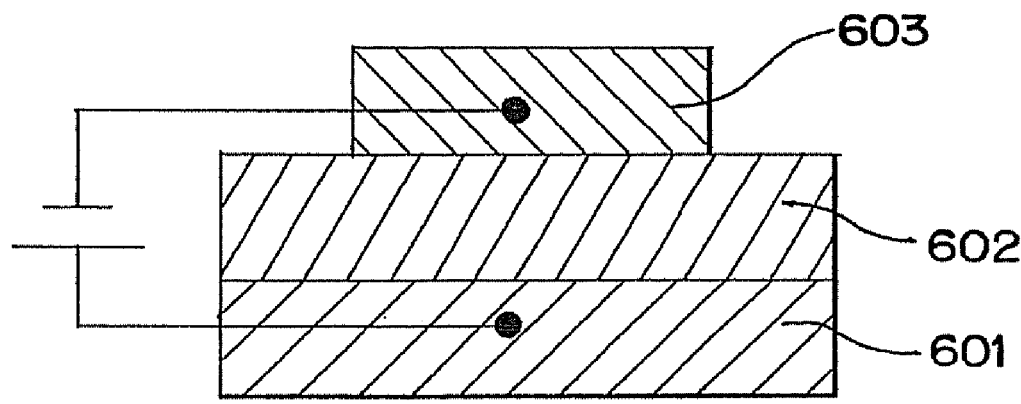
FIGS. 6(a) and 6(b) are diagrams showing the structure of the electroluminescent devices according to the present invention.

FIG. 6(a) shows an electroluminescent device that has a structure in which a light-emitting layer 602 containing an organic-inorganic hybrid material according to the present invention is interposed between the anode 601 and the cathode 603. On this occasion, it is preferable to further add a hole transporting material as mentioned above in the case where a functional chelating agent bonded to a matrix shows an electron transporting property, or alternatively, it is preferable to further add an electron transporting material as mentioned above in the case where the functional chelating agent bonded to the matrix shows a hole transporting property, which is because adding those additives makes it possible to improve a balance between carrier injections and carrier transports to improve a luminous efficiency. Further, an organic light emitter (a fluorescent material or a phosphorescent material) as mentioned above may be added to extract a light emission thereof. Obviously, a light emission from the functional chelating agent may be extracted.

Additionally, since many of metal oxide matrixes are insulative while the functional chelating agent shows semiconductivity (i.e. take a role of transporting carriers), the light-emitting layer 602 is made an insulator when the functional chelating agent gets small in amount. Therefore, in the case of applying the organic-inorganic hybrid material according to the present invention to a carrier-injection type electroluminescent device as in the Embodiment Mode 1, it is preferable that the ratio of the functional chelating agent to a metal atom is 0.1 equivalent or more.

It is preferable to use a conductive material that has a large work function as a material of the anode 601. When light is extracted in a direction to the anode side, a transparent conductive material such as indium-tin oxide (ITO) or indium-zinc oxide (IZO) may be used. When the anode side is made for light shielding, in addition to a single layer film such as TiN, ZrN, Ti, W, Ni, Pt, or Cr, a lamination structure of a titanium nitride film and a film containing aluminum as its main component, and a three-layer structure of a titanium nitride film, a film containing aluminum as its main component, and a titanium nitride film can be used. Alternatively, a method of laminating the above-mentioned transparent conductive material on a reflective electrode such as Ti or Al is possible.

In addition, it is preferable to use a conductive material that has a small work function as a material of the cathode 603, and specifically, in addition to an alkali metal such as Li or Cs, an alkali earth metal such as Mg, Ca, or Sr, and alloys including these (such as Mg—Ag or Al—Li), it is also possible to use a rare earth metal such as Yb or Er for forming the cathode 603. In addition, in the case of using an electron injecting layer such as LiF, CsF, CaF$_2$, or Li$_2$O, an usual conductive thin film such as aluminum can be used. In addition, in the case that light is extracted in a direction to the cathode side, a laminated structure of an ultra thin film including an alkali metal such as Li or Cs and an alkali earth metal such as Mg, Ca, or Sr, and a transparent conductive film (such as ITO, IZO, or ZnO) may be used. Alternatively, either an alkali metal or an alkali earth metal and an electron transporting material may be co-evaporated to form an electron injecting layer, and a transparent conductive film (such as ITO, IZO, or ZnO) may be laminated thereon.

Between the anode 601 and the light-emitting layer 602, a hole injecting and transporting layer may be inserted. As materials that can be used for the hole injecting and transporting layer, the above-mentioned hole transporting materials can be used. In addition, porphyrin compounds are efficient among organic compounds, and phthalocyanine (abbreviation: H$_2$—Pc), copper phthalocyanine (hereinafter, referred to as CuPc), and the like can be used. There is also a material of a conductive polymer chemically doped, and polyethylene dioxythiophene (abbreviation: PEDOT) doped with polystyrene sulfonate (abbreviation: PSS), polyaniline (abbreviation: PAni), polyvinyl carbazole (abbreviation: PVK), and the like can be used. Further, a thin film of an inorganic semiconductor such as vanadium pentoxide and an ultra thin film of an inorganic insulator such as aluminum oxide are also efficient.

Further, between the cathode 603 and the light-emitting layer 602, an electron injecting and transporting layer may be inserted. As materials that can be used for the electron injecting and transporting layer, the above-mentioned electron transporting materials can be used. In addition, an ultra thin film of an insulator such as an alkali metal halide such as LiF or CsF, an alkali earth halide such as $CaF_2$, or an alkali metal oxide such as $Li_2O$ is often used. Further, alkali-metal complexes such as lithium acetyl acetonate (abbreviation: Li(acac)) or 8-quinolinolato-lithium (abbreviation: Liq) are also efficient.

In the present invention, a layer interposed between an anode and a cathode, which may include a light-emitting layer, a hole injecting and transporting layer, and an electron injecting and transporting layer, is referred to as an electroluminescent layer.

The thus obtained electroluminescent device is able to achieve light emissions in various colors by changing the type of the functional chelating agent or the type of the organic light emitter. In addition, the structure formula (1), the structure formula (8), and the structure formula (14) emit light respectively in yellow-green, red-orange, and blue, by chelating. Accordingly, a white light emission can also be achieved easily by mixing these at an appropriate ratio.

Embodiment Mode 4

In the Embodiment Mode 4, a structure of an intrinsic electroluminescent device using an organic-inorganic hybrid material according to the present invention will be described with reference to FIG. 6(b). Although a substrate is omitted in FIG. 6(b), the substrate may be on any side of a first electrode 611 and a second electrode 613.

Figure 6B:
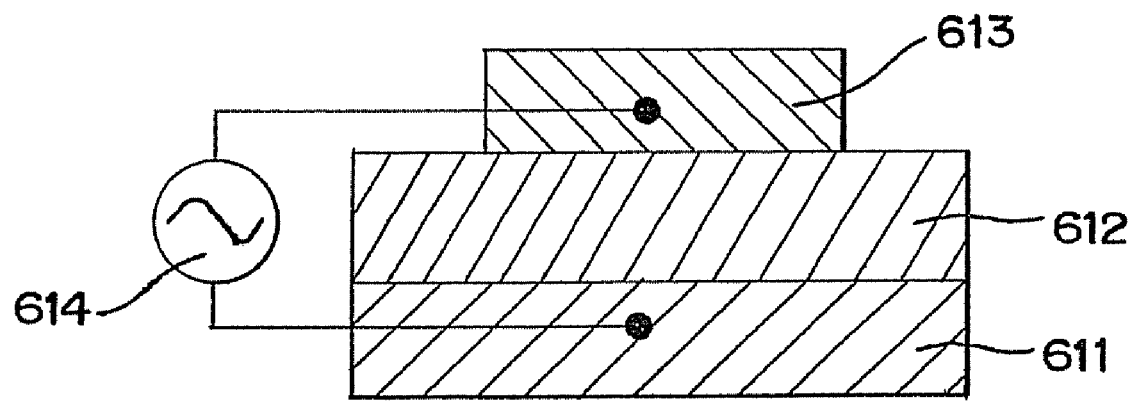

FIG. 6(b) is an electroluminescent device that has a structure in which a light-emitting layer 612 containing an organic-inorganic hybrid material according to the present invention is interposed between the first electrode 611 and the second electrode 613. An organic light emitter (a fluorescent material or a phosphorescent material) as mentioned above may be added to the light-emitting layer 612 to extract a light emission thereof. Obviously, a light emission from a functional chelating agent may be extracted.

A different point from FIG. 6(a) is that the light-emitting layer 612 is made an insulator to avoid current from flowing and a light emission due to collision excitation (that is, intrinsic electroluminescence) is derived by driving with the used of a means 614 for applying alternating current bias. On this occasion, in order to make the light-emitting layer 612 the insulator, contrary to Embodiment Mode 1, it is preferable that the ratio of the functional chelating agent to a metal atom is 0.1 equivalent or less.

Further, a layer of a dielectric (such as barium titanate) that has a high dielectric constant may be formed between the first electrode 611 and the light-emitting layer 612 or between the second electrode 613 and the light-emitting layer 612.

EMBODIMENTS

Embodiment 1

In the present embodiment, a method of preparing a composition for coating application (sol) according to the present invention will be exemplified specifically, where aluminum-sec-butoxide is used as a metal alkoxide, 8-quinolinol is used as an organic compound that shows a coloring property, a light-emitting property, and semiconductivity by chelating a metal atom, and isopropanol is used as an organic solvent, and ethyl acetoacetate is used as a chemical modifier.

First, in a glove box with relative humidity kept at 5% or less, 0.493 g (2 mmol) of aluminum-sec-butoxide (from Tokyo Kasei Kogyo Co., Ltd.) was dispersed in 2.404 g (40 mmol) of dehydrated isopropanol (from Kanto Kagaku). Next, a solution of a chemically modified metal alkoxide was prepared by dropping 0.390 g (3 mmol) of ethyl acetoacetate (from Kishida Chemical Co., Ltd.) while stirring.

Separately from this, in the glove box, a solution of 8-quinolinol was prepared by dissolving 0.145 g (1 mmol) of 8-quinolinol (from Tokyo Kasei Kogyo Co., Ltd.) in 6.010 g (100 mmol) of dehydrated isopropanol and adding 0.090 ml (about 5 mmol) of pure water.

Then, the thus obtained solution of 8-quinolinol was dropped in the above-mentioned solution of the metal alkoxide while stirring. On dropping, the transparent and colorless solution changed to a yellow color. By stirring for 1 hour after further dropping, a composition for coating application (sol) according to the present invention was obtained. Precipitation as observed in an usual synthesis of a metal complex was not observed at all. The manufactured sol composition at this time has a ratio of aluminum-sec-butoxide:8-quinolinol:ethyl acetoacetate:water:isopropanol=2:1:3:5:140 [unit; mmol].

Figure 11:
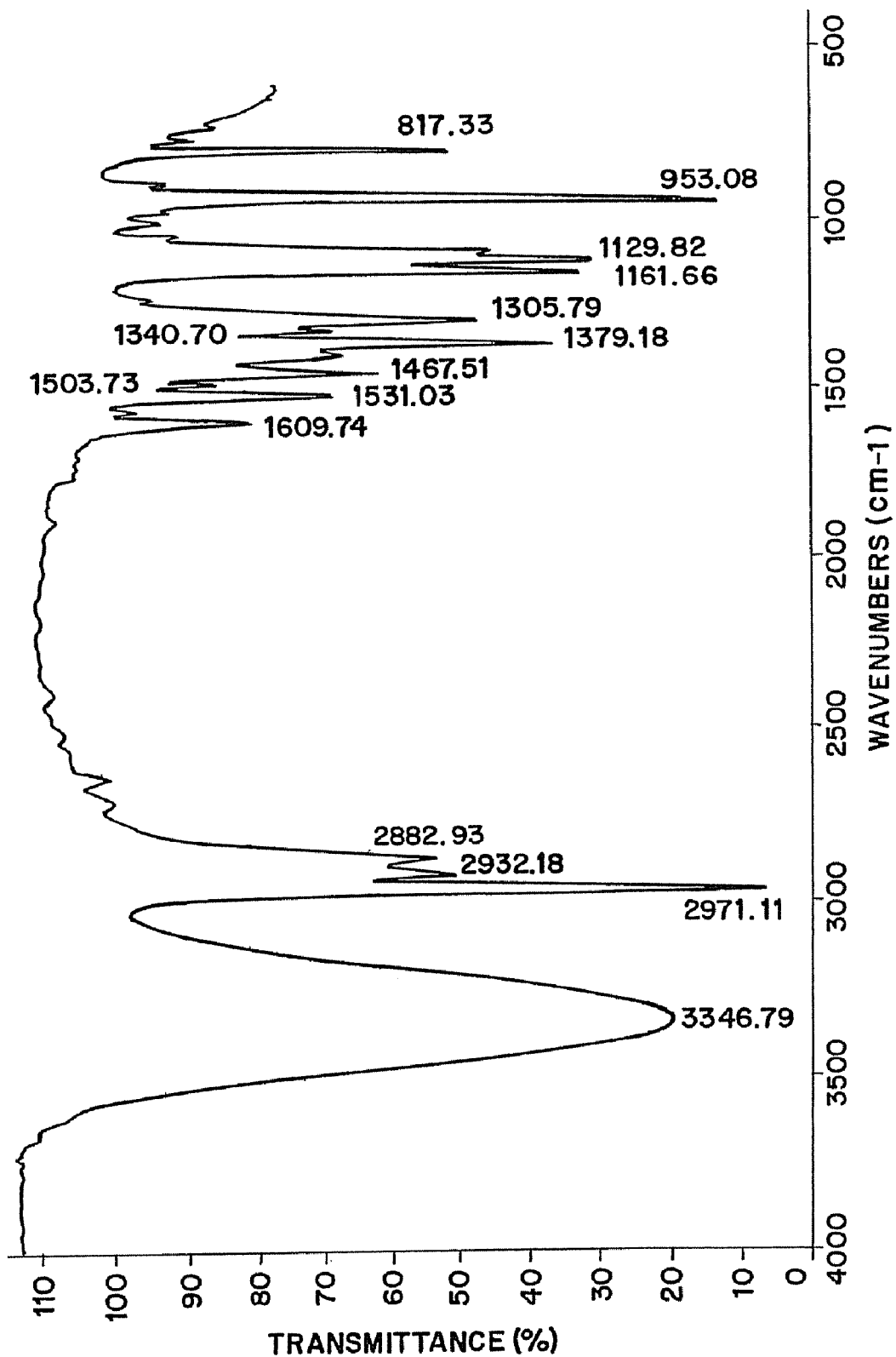
FIG. 11 is a diagram showing an IR absorption spectrum of a composition for coating application, which is prepared in Embodiment 1.

The thus obtained composition for coating application (sol) according to the present invention, IR absorption spectrum was measured by a liquid membrane technique. As a measurement system, an infrared spectrophotometer (from Thermo Nicolet Corp.) was used. The result is shown in FIG. 11. In FIG. 11, while many of peaks are attributed to isopropanol that is the solvent, peaks are observed in the vicinity of 1610 $cm^{-1}$ of C—O stretching vibration in an enol form and in the vicinity of 1530 $cm^{-1}$ of C=C stretching vibration of a six-membered ring due to a formation of a chelate ring, and 1730 $cm^{-1}$ of C=O stretching vibration in a keto form is observed very little. Consequently, the result suggests that the ethyl acetoacetate mostly forms a chelate ring (fullfils a role of a chemical modification). In addition, since the composition was colored in yellow on dropping the solution of 8-quinolinol as described above, the 8-quinolinol obviously forms a chelate ring. From the description above, it turns out that both the ethyl acetoacetate and the 8-quinolinol chelate aluminum in the sol of the present embodiment.

Embodiment 2

In the present embodiment, a method of synthesizing an organic-inorganic hybrid material according to the present invention, in which an alumia matrix is chelated by 8-quinolinol, will be exemplified specifically.

First, the sol obtained in Embodiment 1 was dropped on a quartz substrate through a 0.45 μm filter to perform spin coating under conditions of 800 rpm and 30 seconds. After the spin coating, drying and calcining was conducted under four kinds of conditions shown in the following Table 1 to obtain four kinds of samples in total. The calcining was conducted under a nitrogen atmosphere in a gas exchange furnace.

TABLE 1

| sample No. | condition of drying and calcining |
|---|---|
| (1) | drying by leaving at room temperature under an atmosphere |
| (2) | calcining at 80° C. for 1 h |
| (3) | After calcining under the condition of (2), further calcining at 150° C. for 1 h |
| (4) | After calcining under the condition of (3), further calcining at 200° C. for 1 h |

Figure 12:
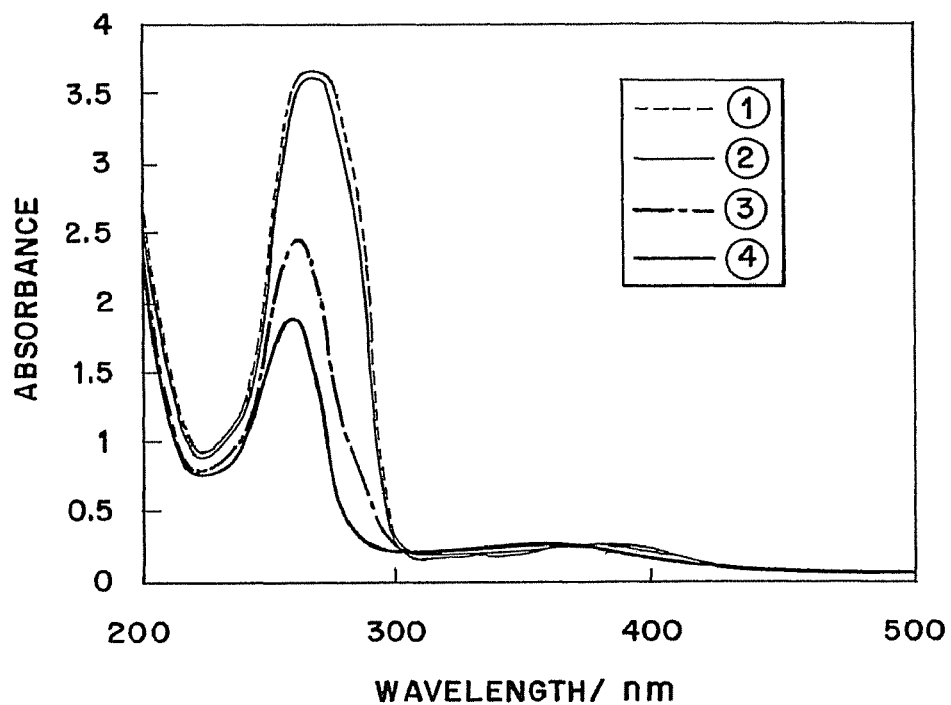
FIG. 12 is a diagram showing an UV-Vis absorption spectrum of an organic-inorganic hybrid material synthesized in Embodiment 2.

An UV-Vis spectrophotometer (from JASCO corporation) was used to measure UV-Vis absorption spectra of the respective samples (1) to (4). The results are shown in FIG. 12. As shown in FIG. 12, when (2) and (3) are compared, a broad spectrum of 260 to 270 nm in (2) is varied to a sharp spectrum of 260 nm in (3). When 8-quinolinol forms a chelate ring with a metal, absorptions are observed at two places, from 370 to 380 nm and in the vicinity of 260 nm. On the other hand, when ethyl acetoacetate forms a chelate ring with a metal, absorption is observed in the vicinity of 270 nm (to be described in Comparative Example 1). Consequently, it is believed that aluminum is coordinated by both 8-quinolinol and ethyl acetoacetate at 80° C. or less so that absorptions of 260 nm and 270 nm are overlapped to develop the broad absorption. In addition, on the calcining at 150° C., it is believed that the chelate coordination of 8-quinolinol is remaining while the chelate coordination of ethyl acetoacetate is mostly uncoupled so that the sharp peak in the vicinity of 260 nm is remaining (in fact, the absorption of 370 to 380 nm have not disappeared either, and the sample is yellow in color, which suggest that the chelating 8-quinolinol is remaining).

In sol-gel method, it is known that a chemical modifier such as ethyl acetoacetate is desorbed by calcining to form a metal oxide matrix (a bond of metal-oxygen-metal). Consequently, from FIG. 12, it can be said that an alumina matrix is formed and that aluminum is coordinated by 8-quinolinol that is a functional chelating agent in the samples (3) and (4) (that is, the conditions of calcining from 150° C. to 200° C.). From the descriptions above, it turns out that an organic-inorganic hybrid material according to the present invention is synthesized.

In addition, (3) and (4) are colored in yellow due to the broad absorption overlapping a visible light range (having a peak top of 370 to 380 nm), and accordingly, it turns out that a colored organic-inorganic hybrid material can be synthesized by implementing the present invention.

Figure 13:
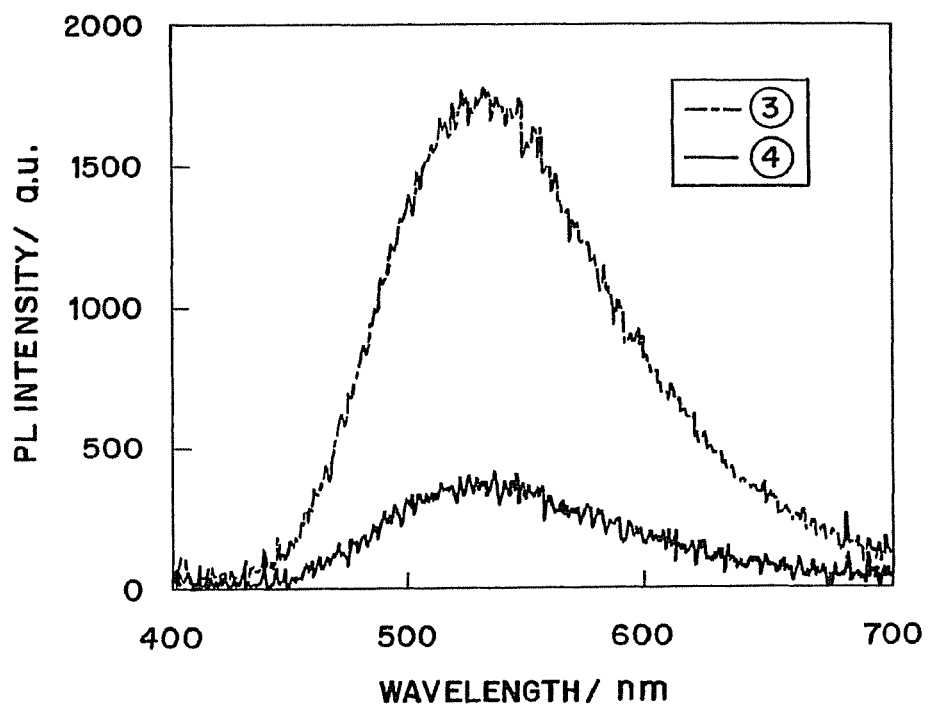
FIG. 13 is a diagram showing a PL spectrum of an organic-inorganic hybrid material synthesized in Embodiment 2.

Further, FIG. 13 shows result of measuring photoluminescence of (3) and (4), with exciting light of 365 nm. As shown in FIG. 13, either sample shows a yellow-green light emission that has a peak in the vicinity of 530 nm. Accordingly, it turns out that a light-emitting organic-inorganic hybrid material can be synthesized by implementing the present invention.

Comparative Example 1

In the present comparative example, conventional sol in the state where 8-quinolinol is removed from the sol of Embodiment 1 (that is, sol using aluminum-sec-butoxide as a metal alkoxide, ethyl acetoacetate as a chemical modifier, and isopropanol as an organic solvent) was prepared to conduct coating and calcining.

First, in the same way as in Embodiment 1, sol of aluminum-sec-butoxide ethyl acetoacetate:water:isopropanol=2:3: 5:140 [unit; mmol] was prepared. Next, spin coating on a quartz substrate was conducted in the same way as in Embodiment 2, and four kinds of samples in total, dried and calcined under the above-mentioned conditions ((1) to (4)) of Table 1, were obtained.

Figure 14:
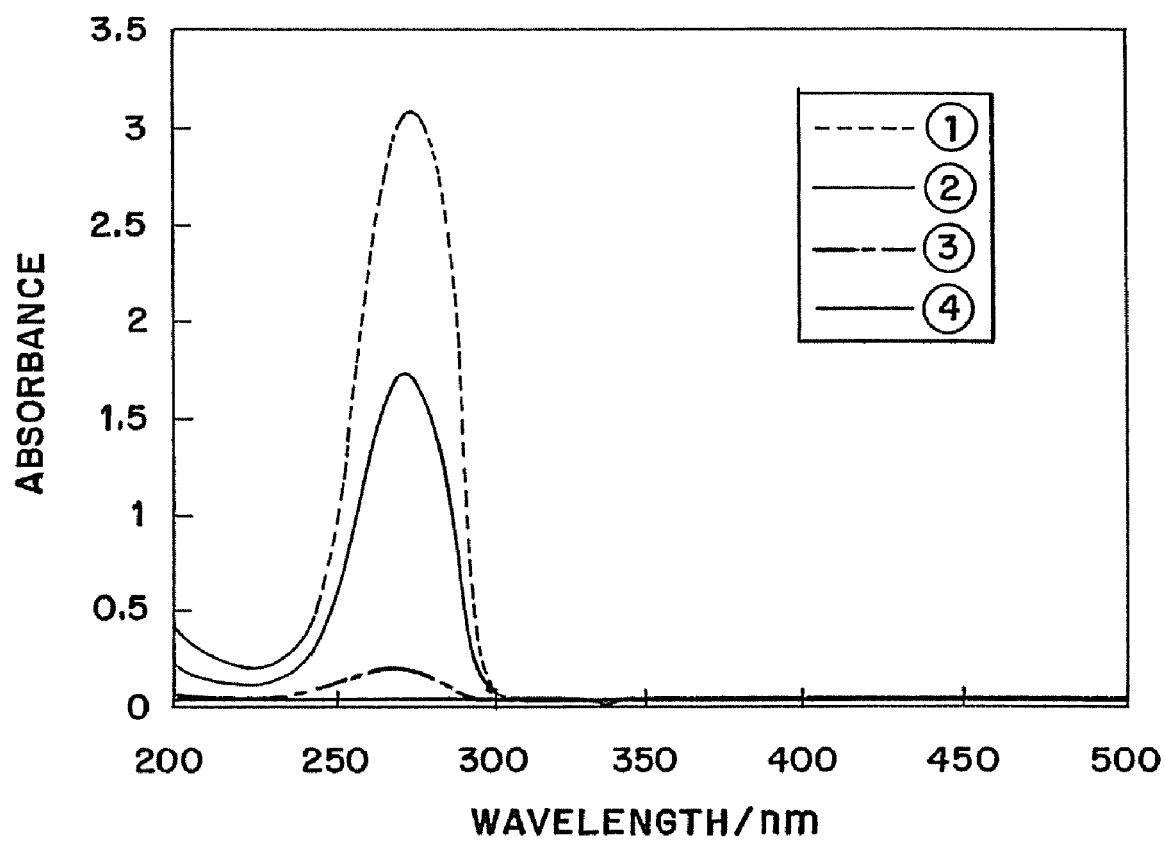
FIG. 14 is a diagram showing an UV-Vis absorption spectrum of a conventional metal oxide thin film synthesized in Comparative Example 1.

FIG. 14 shows results of measuring UV-Vis absorption spectra of the respective samples (1) to (4) in the present comparative example. As shown in FIG. 14, absorption in the vicinity of 270 nm, generated by ethyl acetoacetate forming a chelate ring with a metal is reduced with the increase of calcining temperature, which suggests, in other words, ethyl acetoacetate is desorbed with the increase of calcining temperature and almost completely removed at 150° C. to 200° C. to become just an amorphous alumina thin film. Accordingly, an organic-inorganic hybrid material could not be formed.

In addition, while a chelate ring of ethyl acetoacetate is remaining in the conditions of (1) or (2) (that is, calcining temperature at 80° C. or less), a function such as a coloring property or a light-emitting property was not observed at all.

Embodiment 3

In the present embodiment, current-voltage characteristics of an organic-inorganic hybrid material according to the present invention will be exemplified specifically.

First, in the same way as in Embodiment 1, sol of aluminum-see-butoxide: 8-quinolinol:ethyl acetoacetate:water: isopropanol=4:1:4:12:100 [unit; mmol] was prepared.

Next, the above-mentioned sol was dropped to a substrate that has an electrode containing ITO formed in 2 square-mm size through a 0.45 μm filter to perform spin coating under conditions of 800 rpm and 60 seconds. After the spin coating, calcining was conducted under an air atmosphere at 80° C. for 1 hour, and then, at 20° C. for 2 hours to obtain, on the ITO, a thin film containing an organic-inorganic hybrid material according to the present invention. Further, on this thin film, Al was deposited in a vacuum deposition system to be about 100 nm in thickness.

Figure 15A:
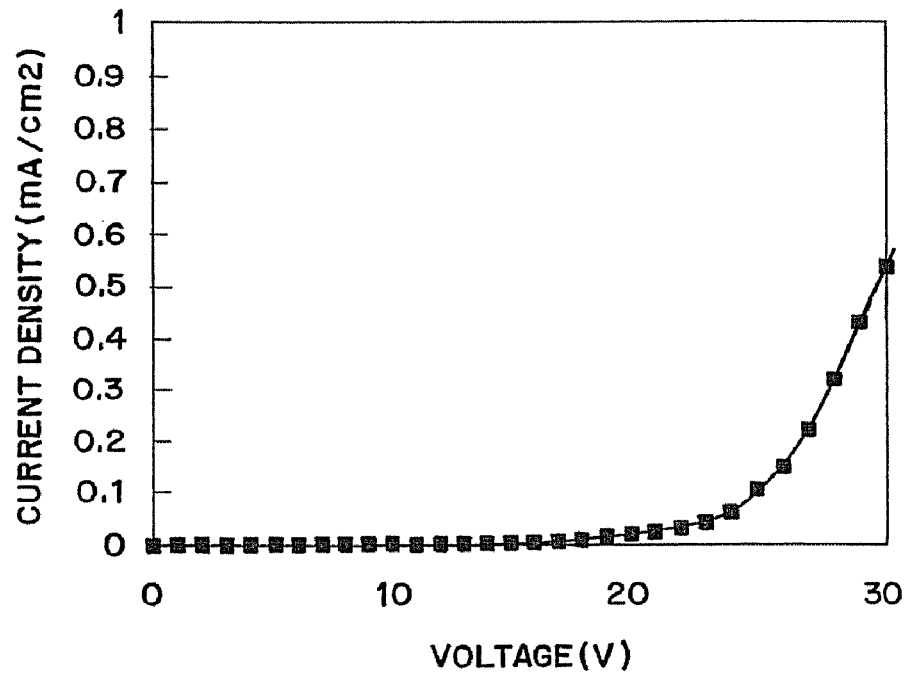
FIGS. 15(a) and 15(b) are a linear and a double logarithmic plots of current-voltage characteristics of an organic-inorganic hybrid material synthesized in Embodiment 3, respectively.
Figure 15B:
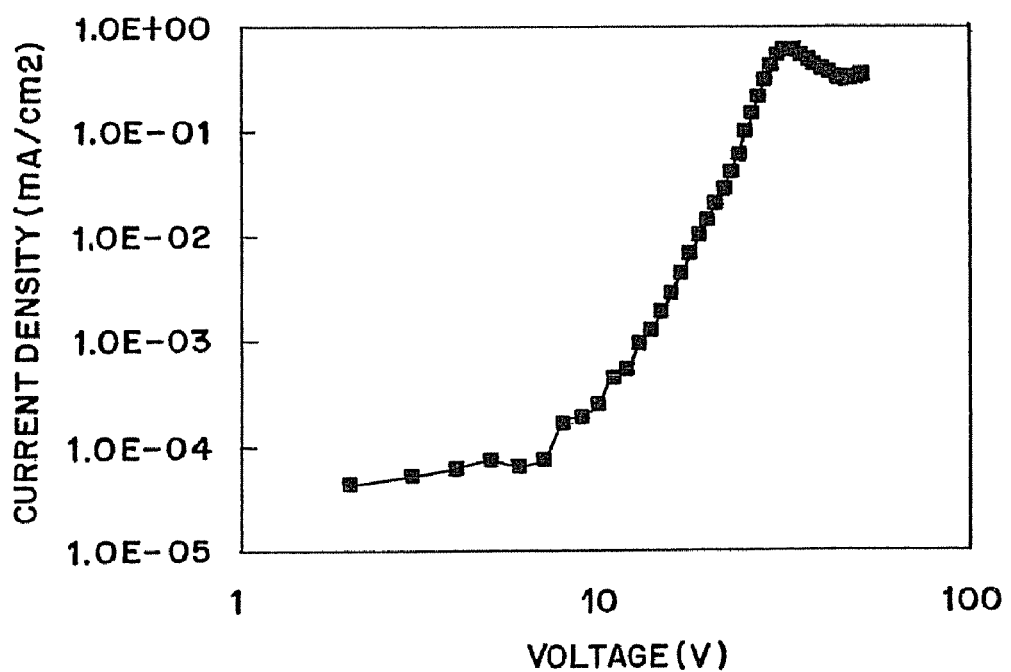

FIG. 15(a) shows current-voltage characteristics at the time of biasing the thus obtained device with ITO as a plus terminal and Al as a minus terminal with respect to the thus obtained device. In the case of this device, a current flowed at a current density of 0.1 mA/cm$^2$ by applying a voltage of 25V. Further, a double logarithmic plot of the current-voltage characteristics of FIG. 15(a) is as in FIG. 15(b), and a distinct bending point is identified in the vicinity of 10 V. Since it is believed that this bending point is identified generally on making the transition from a region of ohmic current to a region of space-charge limited current, the organic-inorganic hybrid material according to the present invention makes a sufficient amount of space-charge limited current flow, in other words, shows semiconductivity.

Embodiment 4

In the present embodiment, a method of preparing a composition for coating application (sol) according to the present invention will be exemplified specifically, where aluminum chloride is used as a metal salt, 8-quinolinol is used as an organic compound that shows a coloring property, a light-emitting property, and semiconductivity by chelating a metal atom, and ethanol is used as an organic solvent, and tetraethoxysilane is further added as an alkoxysilane.

First, 0.533 g (4 mmol) of aluminum chloride (from Kishida Chemical Co., Ltd.) and 0.581 g (4 mmol) of 8-quinolinol (from Tokyo Kasei Kogyo Co., Ltd.) were dissolved in 20 ml of ethanol. Next, Separately from this, a solution of 1.667 g (8 mmol) of tetraethoxysilane (TEOS) (from Wako Pure Chemical Industries, Ltd.) dispersed in 8 ml of ethanol was prepared, and added to the above-mentioned ethanol solution. 4 ml of water was further added. At this time, pH was 1 to 3 approximately.

Then, after stirring the obtained solution for about 1.5 hours, a composition for coating application (sol) according to the present invention was obtained by leaving at rest for 2 days. The manufactured sol composition at this time has a ratio of aluminum chloride:8-quinolinol:TEOS=4:8:4 [unit;

mmol]. In the case of this composition for coating application, precipitation was not observed at all either after a week passed.

Embodiment 5

In the present embodiment, an organic-inorganic hybrid material according to the present invention, further including a silica moiety in addition to a metal oxide matrix, will be exemplified specifically.

First, the sol obtained in Embodiment 4 was dropped on a quartz substrate through a 0.45 μm filter to perform spin coating under conditions of 800 rpm and 30 seconds. After the spin coating, by drying under an air atmosphere at 60° C. for 1 hour, and then, calcining at 150° C. for 2 hours, an organic-inorganic hybrid material was obtained.

According to an analysis of the obtained organic-inorganic hybrid material by X-ray Photoelectron Spectroscopy (referred to as ESCA or XPS), peaks were detected in the vicinity of 103 eV indicating a $SiO_2$ (silica) moiety and in the vicinity of 75 eV indicating an $Al_2O_3$ (alumina) moiety. The amount of chlorine included in aluminum chloride as a raw material was below a detection limit. Accordingly, the analysis suggests that a silica moiety and an alumina moiety are formed.

In addition, since a peak of an absorption spectrum is observed from 370 to 380 nm as in Embodiment 2, it turns out that 8-quinolinol forms a chelate ring with respect to aluminum. From the descriptions above, it turns out that an organic-inorganic hybrid material according to the present invention is synthesized.

The organic-inorganic hybrid material of the present embodiment was, as in Embodiment 2, colored in yellow due to the broad absorption overlapping a visible light range (having a peak top of 370 to 380 nm), and showed a yellow-green light emission that has a peak in the vicinity of 530 nm.

Embodiment 6

In the present embodiment, an example will be described, where a composition for coating application (sol) according to the present invention, using aluminum chloride as a metal salt, 8-quinolinol an organic compound that shows a coloring property, a light-emitting property, and semiconductivity by chelating a metal atom, and ethanol as an organic solvent, and tetraethoxysilane as an alkoxysilane, is prepared, and an organic-inorganic hybrid material according to the present invention is synthesized with the use of it. In addition, comparative examples with respect to it will be exemplified.

Embodiments 6-1 and 6-2

In the present embodiments, sol of a composition as shown in the following Table 2 was prepared in the same way as in Embodiment 4. The amounts of ethanol and water were made the same as those of Embodiment 4. In Embodiment 6-1, as in Embodiment 4, precipitation was not observed at all. In Embodiment 6-2, coating was adequately possible while precipitation was slightly observed. At this time, pH was 1 to 3 approximately.

TABLE 2

Composition Ratio of Sol in Embodiment 6

| | Embodiment 6-1 | Embodiment 6-2 | Comparative Example 2 | Comparative Example 3 |
|---|---|---|---|---|
| aluminum chloride | 4 | 4 | — | 4 |
| 8-quinolinol | 4 | 4 | — | 12 |
| TEOS | 8 | 40 | 8 | 8 |
| hydrochloric acid | No | No | Yes* | Yes* |
| $Alq_3$ | — | — | 4 | — | unit; [mmol]
*added in order to uniform pH in Embodiments 6-1 and 6-2

Comparative Example 2

In order to make a state in which tris (8-quinolinolato) aluminum (abbreviation: $Alq_3$) that is a metal complex (a molecule) with 8-quinolinol as a ligand is simply dispersed in silica, sol of a composition shown in the above Table 2 was prepared. The amounts of ethanol and water were made the same as those of Embodiment 4. In the sol of the present comparative example, the solubility of $Alq_3$ was so low that a complete liquid state could not obtained.

Comparative Example 3

For comparison, sol of a composition shown in the above Table 2 (that is, one that has 3 equivalents of 8-quinolinol added in order for the number of ligands to saturate aluminum that is a trivalent metal) was prepared. The amounts of ethanol and water were made the same as those of Embodiment 4.

Next, each of the four kinds of sol obtained according to Table 2 (However, since the sol of Comparative Example 2 has a lot of precipitation, supernatant liquid was used) was dropped on a quartz substrate through a 0.45 μm filter to perform spin coating under conditions of 800 rpm and 30 seconds. After the spin coating, by drying under an air atmosphere at 60° C. for 1 hour, and then, calcining at 150° C. for 2 hours, A. an organic-inorganic hybrid material using the sol of Embodiment 6-1 according to the present invention, B. an organic-inorganic hybrid material using the sol of Embodiment 6-2 according to the present invention, C. a comparative sample using the sol of Comparative Example 2, and D. a comparative sample using the sol of Comparative Example 3 were respectively obtained, each of which were colored in yellow.

Figure 16:
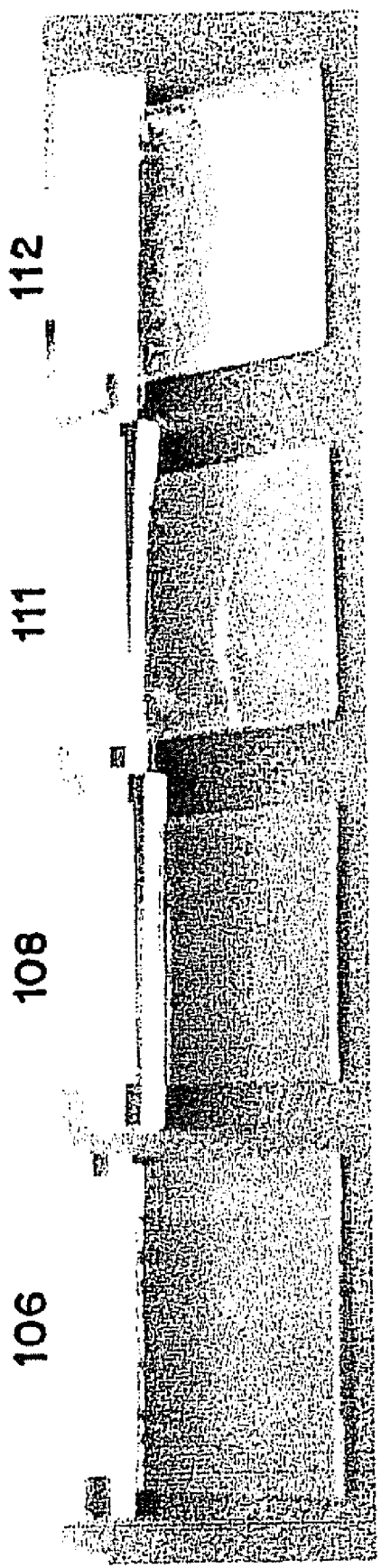
FIGS. 16(A) to 16(D) are diagrams showing photographs of four kinds of samples synthesized in Embodiment 6.

When these four kinds of samples were immersed and left for 5 minutes, the coloring came off in the sample C and the sample D while the coloring did not come off in the sample A or the sample B. FIG. 16 shows the appearances.

From these results, it is believed that, in the samples A and B of the organic-inorganic hybrid materials according to the present invention, an organic group (8-quinolinol) was not easily removed since 8-quinolinol is directly bonded to an alumina matrix. On the other hand, it is believed that, in the samples C and D of the comparative samples, there was no interaction between 8-quinolinol and a metal oxide matrix to liquate out easily as $Alq_3$ since an $Alq_3$ molecule is dispersed in silica simply.

Embodiment 7

In the present embodiment, an example of applying an organic-inorganic hybrid material according to the present invention to a carrier-injection type electroluminescent device will be exemplified specifically. As a device structure, a structure of the structure shown in FIG. 6(a) that has a hole injecting and transporting layer inserted is used.

First, an anode is formed over a glass substrate that has an insulating surface. ITO that is a transparent conductive film is used as a material to be formed with a film thickness of 110 nm by sputtering. The anode is formed with a size of 2 mm×2 mm.

Next, a hole injecting and transporting layer that is approximately 30 nm in thickness is obtained by spin coating of an aqueous solution in which PEDOT and PSS are mixed on the anode and baking at 150° C. Further, a light-emitting layer is formed by spin coating of the sol described in Embodiment 1 on the hole injecting and transporting layer and baking at 80° C. for 1 hour and 150° C. for 2 hours. The thus formed hole injecting and transporting layer and light-emitting layer function as an electroluminescent layer.

Lastly, a cathode is formed. In the present embodiment, an aluminum and lithium alloy (Al—Li) is formed by vacuum deposition with resistance heating to be 100 nm.

In this way, a carrier-injection type electroluminescent device according to the present invention is formed. Although an example of forming an anode on a substrate is described in the Embodiment 3, the present invention is not limited to this. It is also possible to form a cathode over a substrate. However, in this case (that is, the case of replacing the anode with the cathode), the electroluminescent layer has a reverse buildup sequence from the case shown in the present embodiment.

Further, although the anode is a transparent electrode to have a structure where light generated in the electroluminescent layer is emitted from the anode side in the present embodiment, the present invention is not limited to this and a structure where light is emitted from the cathode side by selecting a suitable material for having a transmittance is also applicable.

Embodiment 8

In the present embodiment, a glass product that has a surface coated with an organic-inorganic hybrid material according to the present invention will be exemplified specifically.

First, the sol shown in Embodiment 1 is prepared to coat a surface by dipping a transparent glass bottle (dip coating). Next, a yellow colored glass bottle can be obtained by baking at 80° C. for 1 hour and at 150° C. for 2 hours. In addition, a yellow-green fluorescent glass bottle can be obtained.

A conventional colored glass bottle colored by adding an impurity such as iron has a problem that recycling is difficult. However, a glass bottle as obtained in the Embodiment 4 can be recycled easily since it is possible to be isolated from an organic-inorganic hybrid material at the surface by a method such as heating to a glass melt temperature or more.

Embodiment 9

In the present embodiment, a light-emitting device that has a carrier-injection type electroluminescent device according to the present invention in a pixel portion will be described with reference to FIG. 7. FIG. 7(A) is a top view showing the light-emitting device and FIG. 7(B) is a sectional view of FIG. 7(A) cut along A-A'. Reference numeral 701 indicated by a dotted line denotes a source side driver circuit, 702 denotes a pixel portion, and 703 denotes a gate side driver circuit. In addition, reference numeral 704 denotes a sealing substrate and 705 denotes a sealing agent. An inside region 706 surrounded by the sealing agent 705 may be space filled with an inert gas or may be filled with a solid such as a resin.

Reference numeral 707 denotes a connecting wiring for transmitting signals to be input to the source side driver circuit 701 and the gate side driver circuit 703, and receives a video signal, a clock signal, a start signal, a reset signal, and the like from FPC (Flexible Printed Circuit) 708 that serves as an external input terminal. Though only the FPC is shown in the figure here, a printed wiring board (PWB) may be attached to the FPC. The light-emitting device in the specification includes not only a light-emitting device body but also a state where an FPC or a PWB is attached thereto.

Next, the sectional structure will be explained with reference to FIG. 7(B). The driver circuits and the pixel portion are formed over a substrate 710. Here, the source side driver circuit 701 as the driver circuit portion and the pixel portion 702 are shown.

In the source side driver circuit 701, a CMOS circuit is formed of a combination of an n-channel TFT 723 and a p-channel TFT 724. The TFTs forming the driver circuit may also be formed of a known CMOS circuit, PMOS circuit, or NMOS circuit. Although the present embodiment mode shows a driver integrated type in which a driver circuit is formed over a substrate, which is not always necessary, the driver circuit can be formed not on the device substrate but at the outside thereof.

The pixel portion 702 is formed of a plurality of pixels, each including a switching TFT 711, a current controlling TFT 712, and a first electrode 713 connected to a drain thereof electrically. In addition, an insulator 714 is formed to cover an edge of the first electrode 713. Here, a positive photosensitive acrylic resin film is used to form the insulator 714.

Besides, in order to obtain a favorable coverage, the insulator 714 has a top portion or bottom potion formed with a curved surface with a curvature. For example, in the case of using positive photosensitive acrylic as a material of the insulator 714, it is preferable that only the top portion of the insulator 714 has a curved surface with a curvature radius (0.2 μm to 3 μm). In addition, any of a photosensitive negative type that becomes insoluble in an etchant by light and a positive type that becomes soluble in an etchant by light can be used as the insulator 714.

On the first electrode 713, an electroluminescent layer 715 and a second electrode 716 are respectively formed. Here, as a material that is used for the first electrode 713 functioning as an anode, it is preferable to use a material that has a large work function. For example, in addition to a single layer such as an ITO (indium tin oxide) film, an indium zinc oxide (IZO) film, a titanium nitride film, a chromium film, a tungsten film, a Zn film, and a Pt film, a laminate of a titanium nitride film and a film including aluminum as its main component, a three-layer structure of a titanium nitride film, a film including aluminum as its main component, and a titanium nitride film, and the like can be used. When a laminated structure is employed, the resistance as a wiring is low, favorable ohmic contact can be taken, and it is possible to function as an anode.

Further, for the electroluminescent layer 715, an organic-inorganic hybrid material according to the present invention can be used partially or entirely. Specifically, the structure as mentioned in Embodiment 3 may be applied.

In addition, as a material that is used for the second electrode (cathode) 716 formed on the electroluminescent layer 715, a material that has a small work function (Al, Ag, Li, Ca, an alloy thereof such as MgAg, MgIn, AlLi, $CaF_2$, or CaN) may be used. In the case of transmitting light generated in the electroluminescent layer 715 through the second electrode 716, it is preferable to use a laminate of a thinned metal thin film and a transparent conductive film (such as ITO (an alloy of indium oxide and tin oxide), an alloy of indium oxide and zinc oxide ($In_2O_3$—ZnO), or zinc oxide (ZnO)) film as the second electrode (cathode) 716.

Further, a structure is obtained by bonding the sealing substrate 704 and the substrate 710 with the sealing agent 705, where an electroluminescent device 717 is equipped in the region 706 surrounded by the substrate 710, the sealing substrate 704, and the sealing agent 705. The region 706 also includes a structure of filled with the sealing agent 705 in addition to a case of filled with inert gas (such as nitrogen or argon).

It is preferable to use epoxy resin for the sealing agent 705. In addition, it is desirable that these materials are a material that allows to transmit as less moisture or oxygen as possible. Further, as a material that is used for the sealing substrate 704, a plastic substrate comprising FRP (Fiberglass-Reinforced Plastics), PVF (polyvinylfluoride), Mylar, polyester, acrylic, or the like can be used besides a glass substrate and a quarts substrate.

In this way, the light-emitting device that has the carrier-injection type electroluminescent device according to the present invention can be obtained.

Embodiment 10

In the present embodiment, a top-emission structured light-emitting device, where light is extracted from the sealing substrate 704 side in the light-emitting device shown in FIG. 7, will be specifically exemplified. FIG. 8(A) shows a schematic view (sectional view) thereof. In FIG. 8(A), the codes of FIG. 7 are cited.

In FIG. 8(A), the first electrode 713 is made to be a light-shielding anode and the second electrode 716 is made to be a light-transmitting cathode whereby to form a top-emission structure. Therefore, as the first electrode 713, a single-layered film such as a titanium nitride film, a chromium film, a tungsten film, a Zn film, and a Pt film, a laminate of a titanium nitride film and a film including aluminum as its main component, a three-layer structure of a titanium nitride film, a film including aluminum as its main component, and a titanium nitride film, and the like can be used. Further, as the second electrode 716, a laminated structure of a thinned metal thin film and a transparent conductive film (such as ITO, IZO, or ZnO) may be used. Here, a titanium nitride film is applied as the first electrode, and a laminated structure of a Mg—Ag alloy thin film and ITO is applied as the second electrode.

In addition, in the light-emitting device of the present embodiment, since the electroluminescent device 717 using an organic-inorganic hybrid material according to the present invention, which emits white light (for example, a structure including a white luminescent organic-inorganic hybrid material as mentioned in Embodiment Mode 1) is used for a display in full colors, a color filter including a coloring layer 811 and a light-shielding layer (BM) 812 (for a simplification, a overcoat layer is not shown here in the figure) is provided.

Further, a transparent protective layer 801 is formed for sealing the electroluminescent device. It is preferable to use an insulating film containing silicon nitride or silicon oxynitride that can be obtained by sputtering (a DC system or a RF system) or PCVD as its main component, a thin film containing carbon as its main component (such as a diamond-like carbon (DLC) film or a carbon nitride (CN) film), or a laminate thereof as this transparent protective layer 801. When a silicon target is used for forming in an atmosphere including nitrogen and argon, a silicon nitride film that has a large blocking effect against impurities such as moisture and an alkali metal can be obtained. Alternatively, a silicon nitride target may be used. Further, a deposition system using remote plasma may be used to form the transparent protective layer. It is preferable to thin a film thickness of the transparent protective layer as much as possible since a light emission is made to pass through the transparent protective layer.

Here, for further sealing of the electroluminescent device 717, the region 706 in FIG. 7 is filled with not only the sealing agent 705 but also a second sealing agent 802 to bond the sealing substrate 704. This sealing operation may be conducted in an atmosphere of an inert gas. It is preferable to use epoxy resin also for the second sealing agent 802 like the sealing agent 705.

Embodiment 11

In the present embodiment, a dual-emission structured light-emitting device, where light is extracted from both the substrate 710 side and the sealing substrate 704 side in the light-emitting device shown in FIG. 7, will be specifically exemplified. FIG. 8(B) shows a schematic view (sectional view) thereof. In FIG. 8(B), the codes of FIG. 7 are cited.

FIG. 8(B) has a fundamental structure similar to that in FIG. 8(A). However, what is different from FIG. 8(A) is that a transparent conductive film such as an ITO film or an IZO film is used as the first electrode 713. Here, the dual-emission structured light-emitting device can be realized by using an ITO.

Although the substrate 710 side has no color filter provided in FIG. 8(B), a color filter may be provided so that the both sides have full range of colors. In this case, the color filter formed for the substrate 710 side may be provided in the same way that is used in a conventional liquid crystal display device and the like.

Embodiment 12

In the present embodiment, various electric appliances completed with the use of a light-emitting device that has an electroluminescent device according to the present invention will be described.

As electric appliances manufactured with the use of a light-emitting device that has an electroluminescent device according to the present invention, a video camera, a digital camera, a goggle-type display (head mount display), a navigation system, a sound reproduction device (such as an in-car audio system or an audio set), a laptop personal computer, a game machine, a personal digital assistant (such as a mobile computer, a mobile phone, a portable game machine, or an electronic book), an image reproduction device equipped with a recording medium (specifically, a device equipped with a display device, which can reproduce a recording medium such as a digital versatile disc (DVD) and display the image), and the like can be given. FIG. 8 shows specific examples of these electric appliances.

Figure 9A:
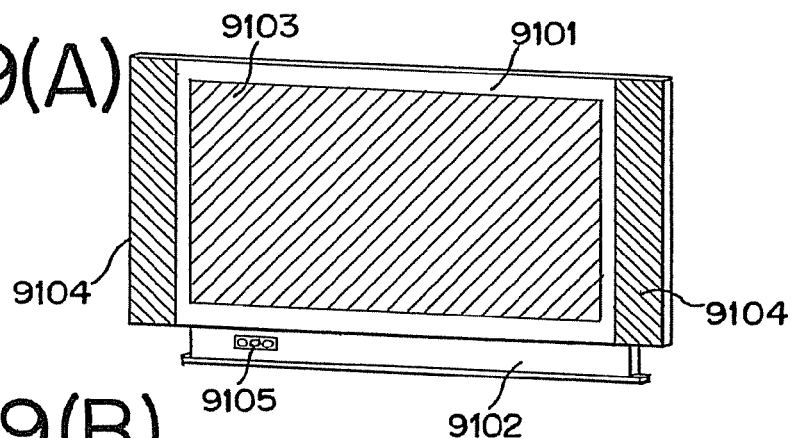
FIGS. 9(A) to 9(G) are diagrams showing examples of electric appliances using a light-emitting device according to the present invention.

FIG. 9(A) is a display device, which includes a frame body 9101, a support 9102, a display portion 9103, a speaker portion 9104, a video input terminal 9105, and the like. A light-emitting device that has an electroluminescent device according to the present invention is used for the display portion 9103 to manufacture the display device. The display device includes all devices for displaying information such as for a personal computer, for receiving TV broad casting, and for displaying an advertisement.

Figure 9B:
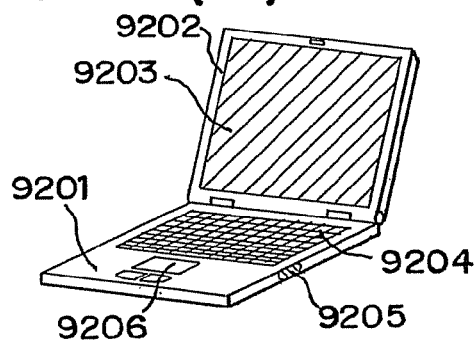

FIG. 9(B) is a laptop personal computer, which includes a main body 9201, a frame body 9202, a display portion 9203, a keyboard 9204, an external connection port 9205, a pointing mouse 9206, and the like. A light-emitting device that has an electroluminescent device according to the present invention is used for the display portion 9203 to manufacture the laptop personal computer.

Figure 9C:
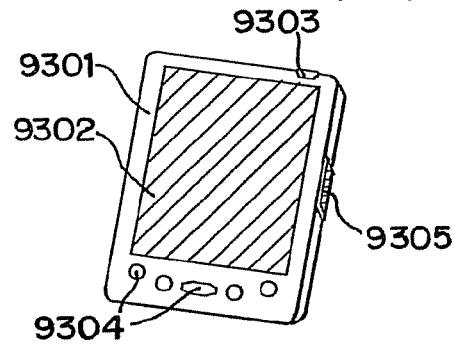

FIG. 9(C) is a mobile computer, which includes a main body 9301, a display portion 9302, a switch 9303, an operation key 9304, an infrared port 9305, and the like. A light-emitting device that has an electroluminescent device according to the present invention is used for the display portion 9302 to manufacture the mobile computer.

Figure 9D:
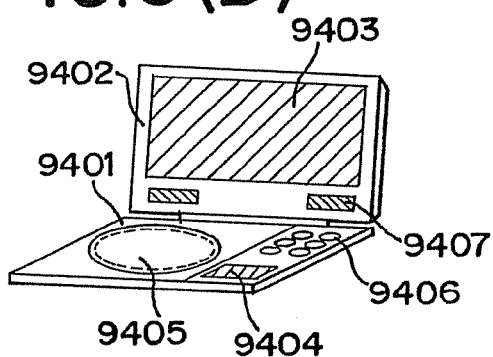

FIG. 9(D) is a portable image reproduction device equipped with a recording medium (specifically, a DVD reproduction device), which includes a main body 9401, a frame body 9402, a display portion A 9403, a display portion B 9404, a recording medium (such as DVD) reading portion 9405, an operation key 9406, a speaker portion 9407, and the like. The display portion A 9403 is used mainly for displaying image information while the display portion B 9404 is used mainly for displaying character information, and a light-emitting device that has an electroluminescent device according to the present invention is used for these display portion A 9403 and display portion B 9404 to manufacture the portable image reproduction device equipped with the recording medium. The image reproduction device equipped with the recording medium further includes a home game machine and the like.

Figure 9E:
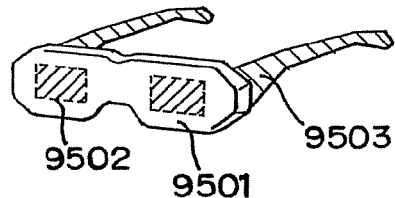

FIG. 9(E) is a goggle-type display (head mount display), which includes a main body 9501, a display portion 9502, an arm portion 9503, and the like. A light-emitting device that has an electroluminescent device according to the present invention is used for the display portion 9502 to manufacture the goggle-type display.

Figure 9F:
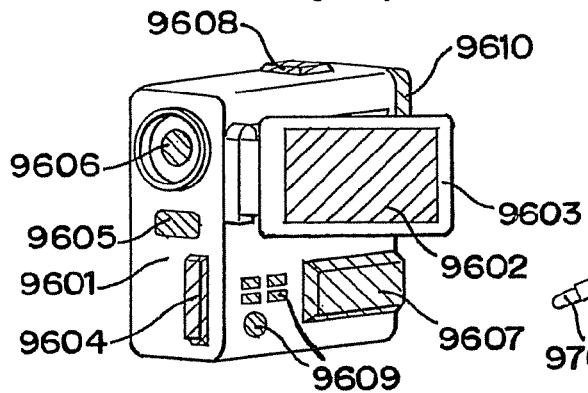

FIG. 9(F) is a video camera, which includes a main body 9601, a display portion 9602, a frame body 9603, an external connection port 9604, a remote control receiving portion 9605, an image receiving portion 9606, a battery 9607, a sound input portion 9608, an operation key 9609, an eye piece 9610, and the like. A light-emitting device that has an electroluminescent device according to the present invention is used for the display portion 9602 to manufacture the video camera.

Figure 9G:
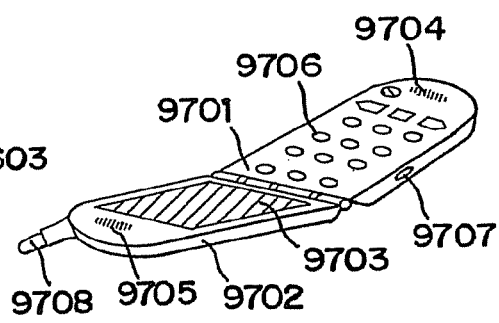

Here, FIG. 9(G) is a mobile phone, which includes a main body 9701, a frame body 9702, a display portion 9703, a voice input portion 9704, a voice output portion 9705, an operation key 9706, an external connection port 9707, an antenna 9708, and the like. A light-emitting device that has an electroluminescent device according to the present invention is used for the display portion 9703 to manufacture the mobile phone. The mobile phone can have power consumption suppressed by displaying white characters on a black background in the display portion 9703.

Figure 10A:
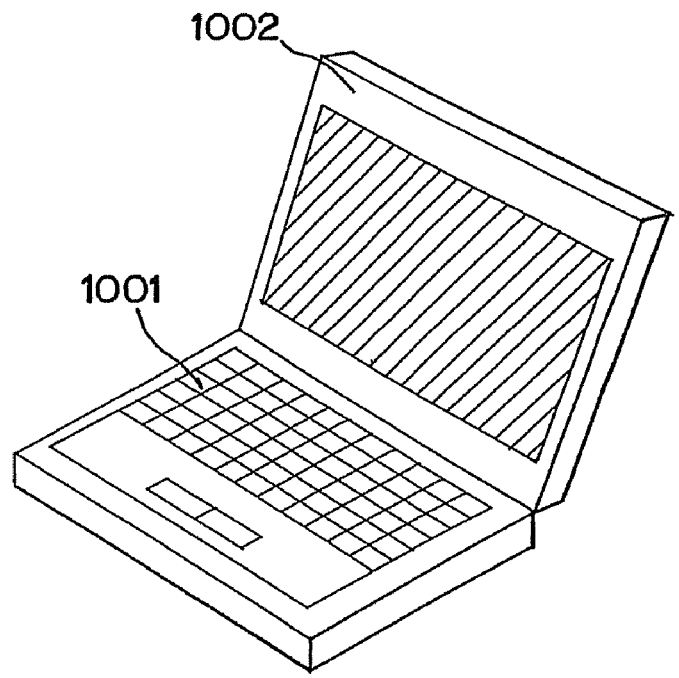
FIGS. 10(a) to 10(c) are diagrams showing examples of electric appliances using a light-emitting device according to the present invention.
Figure 10B:
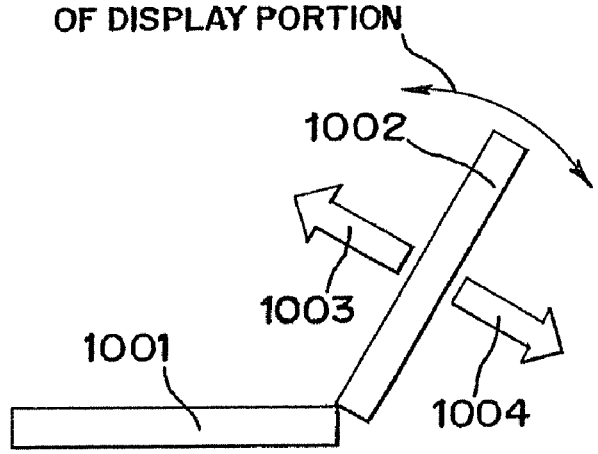
Figure 10C:
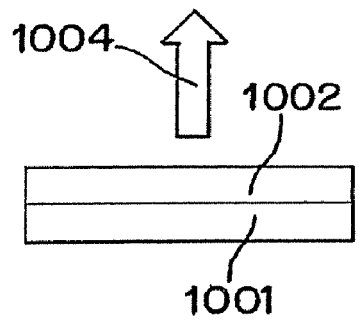

FIG. 10a is a both-emission type laptop PC, which includes a keyboard portion 1001, a display portion 1002, and the like. This laptop PC has a feature of enabling both a light emission 1003 toward a front surface and a light emission 1004 toward a rear surface as shown in FIG. 10b, which is achieved by applying a both-emission structured light-emitting device according to the present invention, for example, as shown in FIG. 8(B), to the display portion 1002. The structure like this makes it possible to view an image and the like by utilizing the light emission toward the rear surface even when the display portion 1002 is closed, as shown in FIG. 10c.

As described above, a light-emitting device that has an electroluminescent device according to the present invention is quite widely applied, and is applicable to electric appliances in all fields.

The invention claimed is:

1. A light-emitting device comprising:
an anode and a cathode; and
an emission layer interposed between the anode and the cathode,
wherein the emission layer comprises an organic-inorganic hybrid material comprising;
 a ligand-doped metal oxide matrix having one kind or plural kinds of metal atoms; and
 a ligand bonded to the metal atom by chelating,
wherein the metal atom is selected from typical metals or transition metals,
wherein the ligand has a phenolic moiety, and an oxygen atom of the phenolic moiety is bonded to the metal atom, and
wherein the ligand further has a heterocycle with a nitrogen atom as a hetero atom and chelates the metal atom by the oxygen atom and the nitrogen atom.

2. The light-emitting device according to claim 1,
wherein the organic-inorganic hybrid material further comprises a second ligand and a third ligand which are bonded to the metal atom by chelating,
wherein the ligand, the second ligand, and the third ligand emit yellow-green light, red-orange light, and blue light, respectively, when they are bonded to the metal by chelating, and
wherein the emission layer is arranged to emit white light by mixing the yellow-green light, the red-orange light, and the blue light.

3. The light-emitting device according to claim 1,
wherein the metal atom is selected from magnesium, calcium, strontium, barium, scandium, yttrium, lanthanum, titanium, zirconium, hafnium, zinc, aluminum, gallium, and indium.

4. The light-emitting device according to claim 1,
wherein the organic-inorganic hybrid material further comprises an aromatic compound which is selected from an organic pigment, an organic light emitter, or an organic semiconductor.

5. The light-emitting device according to claim 1, further comprising a hole injection layer between the anode and the emission layer.

6. The light-emitting device according to claim 1, further comprising a hole transporting layer between the anode and the emission layer.

7. A light-emitting device comprising:
a first electrode;
a dielectric layer formed over the first electrode;
an emission layer formed over the dielectric layer; and
a second electrode formed over the emission layer,
wherein the emission layer comprises an organic-inorganic hybrid material comprising;
 a ligand-doped metal oxide matrix having one kind or plural kinds of metal atoms; and
 a ligand bonded to the metal atom by chelating,
wherein the metal atom is selected from typical metals or transition metals,
wherein the ligand has a phenolic moiety, and an oxygen atom of the phenolic moiety is bonded to the metal atom, and
wherein the ligand further has a heterocycle with a nitrogen atom as a hetero atom and chelates the metal atom by the oxygen atom and the nitrogen atom.

8. The light-emitting device according to claim 7,
wherein the organic-inorganic hybrid material further comprises a second ligand and a third ligand which are bonded to the metal atom by chelating, wherein the ligand, the second ligand, and the third ligand emit yellow-green light, red-orange light, and blue light, respectively, when they are bonded to the metal by chelating, and wherein the emission layer is arranged to emit white light by mixing the yellow-green light, the red-orange light, and the blue light.

9. The light-emitting device according to claim 7, wherein the metal atom is selected from magnesium, calcium, strontium, barium, scandium, yttrium, lanthanum, titanium, zirconium, hafnium, zinc, aluminum, gallium, and indium.

10. The light-emitting device according to claim 7, wherein the organic-inorganic hybrid material further comprises an aromatic compound which is selected from an organic pigment, an organic light emitter, or an organic semiconductor.

11. The light-emitting device according to claim 7, wherein the dielectric layer is a layer of barium titanate.

12. An electric appliance having a light-emitting device, the light-emitting device comprising;

an anode and a cathode; and an emission layer interposed between the anode and the cathode, wherein the emission layer comprises an organic-inorganic hybrid material comprising;

a ligand-doped metal oxide matrix having one kind or plural kinds of metal atoms; and a ligand bonded to the metal atom by chelating, wherein the metal atom is selected from typical metals or transition metals, wherein the ligand has a phenolic moiety, and an oxygen atom of the phenolic moiety is bonded to the metal atom, and wherein the ligand further has a heterocycle with a nitrogen atom as a hetero atom and chelates the metal atom by the oxygen atom and the nitrogen atom.

13. The electric appliance according to claim 12, wherein the organic-inorganic hybrid material further comprises a second ligand and a third ligand which are bonded to the metal atom by chelating, wherein the ligand, the second ligand, and the third ligand emit yellow-green light, red-orange light, and blue light, respectively, when they are bonded to the metal by chelating, and wherein the emission layer is arranged to emit white light by mixing the yellow-green light, the red-orange light, and the blue light.

14. The electric appliance according to claim 12, wherein the metal atom is selected from magnesium, calcium, strontium, barium, scandium, yttrium, lanthanum, titanium, zirconium, hafnium, zinc, aluminum, gallium, and indium.

15. The electric appliance according to claim 12, wherein the organic-inorganic hybrid material further comprises an aromatic compound which is selected from an organic pigment, an organic light emitter, or an organic semiconductor.

16. The electric appliance according to claim 12, further comprising a hole injection layer between the anode and the emission layer.

17. The electric appliance according to claim 12, further comprising a hole transporting layer between the anode and the emission layer.

* * * * *